US008976588B2

(12) United States Patent
Lee

(10) Patent No.: US 8,976,588 B2
(45) Date of Patent: Mar. 10, 2015

(54) NVSRAM CELLS WITH VOLTAGE FLASH CHARGER

(71) Applicant: Aplus Flash Technology, Inc, San Jose, CA (US)

(72) Inventor: Peter Wung Lee, Saratoga, CA (US)

(73) Assignee: Aplus Flash Technology, Inc., Fremont, CA (US)

( * ) Notice: Subject to any disclaimer, the term of this patent is extended or adjusted under 35 U.S.C. 154(b) by 0 days.

(21) Appl. No.: 14/064,222

(22) Filed: Oct. 28, 2013

(65) Prior Publication Data

US 2014/0119120 A1    May 1, 2014

Related U.S. Application Data

(60) Provisional application No. 61/721,467, filed on Nov. 1, 2012.

(51) Int. Cl.
*G11C 11/34* (2006.01)
*G11C 14/00* (2006.01)

(52) U.S. Cl.
CPC .................................. *G11C 14/0063* (2013.01)
USPC ................................ 365/185.08; 365/185.24

(58) Field of Classification Search
CPC ............................ G11C 16/10; G11C 16/0483
USPC ........................................ 365/185.08, 185.24
See application file for complete search history.

(56) References Cited

U.S. PATENT DOCUMENTS

| | | | |
|---|---|---|---|
| 4,703,456 A | 10/1987 | Arakawa | |
| 5,065,362 A | 11/1991 | Herdt et al. | |
| 5,563,839 A | 10/1996 | Herdt et al. | |
| 5,602,776 A | 2/1997 | Herdt et al. | |
| 5,828,599 A | 10/1998 | Herdt | |
| 5,903,561 A | 5/1999 | Kwon | |
| 6,026,018 A | 2/2000 | Herdt et al. | |
| 6,097,629 A | 8/2000 | Dietrich et al. | |
| 6,122,191 A * | 9/2000 | Hirose et al. | 365/185.01 |
| 6,285,586 B1 | 9/2001 | Lung et al. | |
| 6,414,873 B1 | 7/2002 | Herdt | |
| 6,469,930 B1 * | 10/2002 | Murray | 365/185.08 |
| 7,110,293 B2 * | 9/2006 | Jung | 365/185.08 |
| 7,164,608 B2 | 1/2007 | Lee | |
| 7,269,054 B2 | 9/2007 | Kang et al. | |
| 7,280,397 B2 | 10/2007 | Scheuerlein | |
| 7,408,801 B2 | 8/2008 | Kang et al. | |
| 7,505,303 B2 | 3/2009 | Ashokkumar et al. | |
| 7,518,916 B2 | 4/2009 | Ashokkumar et al. | |
| 7,539,054 B2 | 5/2009 | Ashokkumar et al. | |
| 7,663,917 B2 | 2/2010 | Cuppens et al. | |

(Continued)

*Primary Examiner* — Michael Tran
(74) *Attorney, Agent, or Firm* — Raywell Group, LLC

(57) ABSTRACT

The present invention discloses two preferred embodiments of a 12T NVSRAM cell with a flash-based Charger and a pseudo 10T NVSRAM cell with one shared Flash-based Charger. The Flash-based Charger can be made of a 2-poly floating-gate type or a 1-poly charge-trapping SONOS/MONOS flash type, regardless of PMOS type or NMOS type. In an alternative embodiment, the Store operation of above two preferred NVSRAM cell use a DRAM-like charge-sensing scheme with Flash cell configured into a voltage follower associated with Flash Charger and 2-step SRAM amplification technique to amplify the threshold level difference ΔVt stored in the paired Flash transistors. The ΔVt can be detected as low as 1V when the coupled charges through the Flash charger are sufficient by ramping a gate control of the Flash Charger as high as VPP or by increasing the channel length for the Flash Charger.

43 Claims, 10 Drawing Sheets

(56) References Cited

U.S. PATENT DOCUMENTS

| | | |
|---|---|---|
| 7,710,776 B2 | 5/2010 | Johal et al. |
| 7,760,540 B2 | 7/2010 | Still |
| 7,859,899 B1 | 12/2010 | Shakeri et al. |
| 7,890,804 B2 | 2/2011 | Mann et al. |
| 8,018,768 B2 | 9/2011 | Shih et al. |
| 8,036,032 B2 | 10/2011 | Scade et al. |
| 8,331,134 B2 | 12/2012 | Chiu et al. |
| 8,467,243 B1 * | 6/2013 | Shakeri et al. ........... 365/185.08 |

* cited by examiner

US 8,976,588 B2

NVSRAM CELLS WITH VOLTAGE FLASH CHARGER

CROSS-REFERENCE TO RELATED APPLICATIONS

This application claims priority to U.S. Patent Application No. 61/721,467, filed on Nov. 1, 2012, commonly assigned, and hereby incorporated by references in their entireties herein for all purposes.

This application is related to U.S. Pat. No. 7,164,608, U.S. patent application Ser. Nos. 14/037,356, 14/053,549, 14/058, 227, 14/059,618, and 14/064,220, commonly assigned, which are incorporated by reference herein for all purposes.

Additionally, this application is related to U.S. Pat. No. 7,760,540.

TECHNICAL FIELD OF THE INVENTION

The present invention relates to a 12T NVSRAM cell with a flash Charger comprising one LV 6T SRAM cell, one 4T Flash cell and one shared paired Flash Charger transistors (2T) that can be made of a conventional 2-poly Flash transistor or a 1-poly Select transistor by shorting poly2 and poly1 of the flash cell. Additionally, the invention also provides a pair of mirrored 10T NVSRAM cells with a shared 2T flash Charger transistors. These shared 2T Flash Charger transistors are formed by using the available room of layout spacing between two source nodes of two 10T NVSRAM cells laid in same column without taking extra silicon area. Thus, this preferred pseudo-10T NVSRAM cell makes the 12T NVSRAM cell with a flash Charger size effectively equivalent to a 10T cell.

Additionally, during NVSRAM's Recall operation, the flash part of this pseudo-10T NVSRAM cell is configured into a paired Voltage Followers with their respective drain voltages preferably supplied by the coupling-generated charges rather than by the current supply from the VDD pin. As a result, the number of transistors used in each Flash string can be reduced from 3T to 2T without a bottom HV Select transistor that has a big overhead of a long channel length. Thus, the pseudo-10T NVSRAM cell can gain another 15% or more in cell size saving.

BACKGROUND OF INVENTION

Today, a trend of high-density NMOS NVSRAM memory more than 8 Mb is required. Therefore, besides the fixed six transistors (6T) of each SRAM cell, the number of transistors of each NMOS Flash cell should be minimized as much as possible.

Traditionally, a 12T NVSRAM cell comprises one 6T LV SRAM cell and one 6T HV Flash cell including paired 3T Flash strings. Each SRAM cell has paired storage nodes of Q and QB connected to two inputs of the paired Flash strings. Each 3T Flash string further includes one HV Select transistor located on top and another one on bottom, with one 2-poly HV flash transistor sandwiched in the middle of above two HV Select transistors.

Each paired drain nodes of the paired Flash strings are preferably connected to each paired nodes of Q and QB of each 6T LV SRAM cell directly. Conversely, the paired source nodes of each paired Flash strings are connected to a common VDD power supply to provide the different current flows to charge each paired nodes of Q and QB at two different voltage levels for each SRAM cell's subsequent amplification through two different programmed Vts of each paired Flash transistors during the Recall operation.

Although several NVSRAM approaches were disclosed before, the conventional 12T NVSRAM cell using low-current FN-channel program and FN SBPI method is prevailing in the market place. The flash type can be either made of 1-poly charge-trapping SONOS or MONOS type from Cypress or 2-poly floating-gate NMOS or PMOS type from Aplus Flash Technology, Inc., or a trigate flash technology from Simtek. By 2012, the highest density of a 12T NMOS NVSRAM memory in production is 16 Mb.

One big drawback of this 12T NMOS NVSRAM memory is its large 12T cell size that comprises one 6T LV SRAM cell and one 6T HV Flash cell. And each 6T Flash cell further comprises one pair of 3T FStrings and each FString further comprises one top HV Select transistor, one bottom HV Select transistor, and one flash transistor sandwiched by two Select transistors in the middle.

Due to three transistors of each Flash string have to be made of all HV devices to sustain a HV of 5-7V generated by a SBPI (Self-Boosting Program-Inhibit) scheme during the FN-Channel Program operation of NVSRAM cell, the channel length of these two HV Select transistors are made relatively bigger than the ones of a LV SRAM's two PMOS and our NMOS transistors. As a result, it is desirable to achieve any saving of each HV Select transistor in each Flash string so as to drastically reduce the NVSRAM cell size for cost reduction.

SUMMARY OF THE INVENTION

Embodiments of the present invention provide two preferred embodiments of a 12T NVSRAM cell with a Flash Charger and a pseudo-10T NVSRAM cell with one shared Charger that can be made of Flash transistor that take virtually no extra silicon area. The 12T or pseudo-10T NVSRAM cells can be made of a 2-poly floating-gate type or a 1-poly charge-trapping SONOS or MONOS flash type, regardless of PMOS type or NMOS type.

Other than cell size reduction, the Store operation of above the preferred NVSRAM cells use a DRAM-like charge-sharing scheme with Flash cell configured into a voltage follower associated with a charger and 2-step SRAM amplification technique to amplify threshold level difference ΔVt stored in the paired Flash transistors. The ΔVt can be detected as low as 1V when the Charger's coupled charges sufficient enough by ramping Charger's gate as high as VPP or by increasing the channel length for Flash-type Charger.

In an embodiment of the present invention, a 12T NVSRAM cell with a Flash Charger is provided including one LV 6T SRAM cell and one HV 6T Flash cell. Each 6T Flash cell further comprises of one paired 2T Flash string and one paired Flash-based Charger. Each 2T Flash string comprises one Flash transistor serially connected to one Select transistor on top which further connects to one of paired data nodes Q and QB of the corresponding LV 6T SRAM cell.

The Flash transistor and flash-based Charger transistor are preferably made of the same flash type but with a flexibility of different or same channel length. The same flash type means they can be made of either a 2-poly floating-gate type or a 1-poly charge-trapping SONOS and MONOS types, PMOS type or NMOS type.

In another embodiment, the present invention discloses a Pseudo-10T NMOS NVSRAM cell that is configured to coupled with an adjacent Pseudo-10T NVSRAM cell symmetrically sharing one paired 2T NMOS flash-based Charger by one LV 6T SRAM cell plus one paired top Select transistor and one paired 2T NMOS Flash cell without taking the extra MOM.

The transistors in the NMOS Flash cell and NMOS Flash Charger are preferably made of the same flash type but with a flexibility of different channel length. The same flash type means they can be made of either a 2-poly floating-gate type or a 1-poly charge-trapping SONOS and MONOS types. They can also be replaced by a 2-poly floating-gate type.

In yet another embodiment, the present invention discloses a Pseudo-10T NMOS NVSRAM cell that comprises one LV 6T SRAM cell, one paired 2T NMOS 2-poly Flash cell and one paired 2T Flash-based Charger cell with drain and source shorted together and is shared by two adjacent pseudo-10T NMOS NVSRAM cell without taking the extra room.

Note, the way to short the drains nodes and source nodes is not to use metal with a active contact that will create too much parasitic capacitance with an impact of reducing flash cell threshold level difference $\Delta Vt$ between the paired Flash transistors. The preferred way is to make the N-active connection between two separate source nodes and drain nodes of the paired NMOS Flash Charger transistor like forming a NMOS capacitor with the active layer enclosure full poly gate of the Flash Charger.

The shorted drains and sources nodes of one pair of Flash Charger transistors would increase sharing of the coupling-generated charges from both Flash Charger transistor channels when a common gate voltage PumpWL of the pair of Flash Charger transistors is ramped up to a desired voltage, which is above VDD but lower than VPP. As a result, the final data node voltage difference $\Delta V_{Q\text{-}QB}$ is almost doubled over the above version with Source and Drain nodes totally separated for a superior Recall operation.

In still another embodiment, the present invention provides either a 12T NVSRAM cell with a Flash Charger or a Pseudo-10T NVSRAM cell that is configured to use a low-current FN-channel Erase scheme to decrease both flash transistor threshold levels Vts with a same initial low level by applying a negative high-voltage (HV) VNN to the paired Flash transistor gate (FWL) with the paired Flash transistor bulk held at VSS.

In yet still another embodiment, the present invention provides a 12TNVSRAM cell with a Flash Charger or Pseudo-10T NVSRAM cells with a shared Flash Charger that is configured to use a low-current FN-channel Program scheme to increase the paired flash transistor Vts with a desired $\Delta Vt \geq 1.0V$. This Program operation is preferably using a positive HV VPP to the paired Flash transistor gate along with a VSS and VDD-Vt (floating) initially in both flash's channels. The VSS and VDD-Vt are supplied directly from data nodes Q and QB of a 6T SRAM cell in the 12T or the Pseudo-10T NVSRAM cell through a top Select transistor with a Vt drop. During the FN-channel program operation, the floating-channel of VDD-Vt would be coupled to be above 5V when a Flash gate FWL is coupled to the VPP. This is commonly referred as the SBPI (Self-Boosting-Program-Inhibit) method. The flash channel held at the SBPI voltage would be prevented from programming, while the flash channel held at VSS level would be programmed with its Vt increased from initial erased Vt value (<-2V) to a final Vt value (>2V).

In a specific embodiment, the present invention provides a method for using another set of Program and Erase scheme for this 12T NVSRAM cell with a Flash Charger or a Pseudo-10T NVSRAM cells with a shared Flash Charger. The method includes using VPP FN-channel Erase operation to preferably increase both Flash transistor Vts to a same initial value above VDD along with using a VNN FN-edge scheme with a full passage of the VDD and VSS inputs from a paired Q and QB nodes by setting top Select transistor gate signals SG1 and SG2 higher than VDD+Vt to achieve the desired Vt difference $\Delta Vt \geq 1.0V$ for the paired Flash transistor in the 12T NVSRAM cell with a Flash Charger and pseudo-10T NVSRAM cells.

In another specific embodiment, the present invention provides a method for performing a "Recall" operation of the preferred 12T NVSRAM cell with a Flash Charger or a Pseudo-10T NVSRAM cells with a shared Flash Charger that uses a DRAM-like charge-sensing scheme. The method includes converting the $\Delta Vt$ stored in a paired Flash transistor through a voltage follower to a voltage difference $\Delta V_{Q\text{-}QB}$ at Q and QB nodes thought the aid of Flash-based Charger. Lastly, the small $\Delta V_{Q\text{-}QB}$ is fully amplified to VDD and VSS by two steps. The first step is to ramp up a SRAM's VDDP power line for a first amplification and the second step is to ramp down a SRAM's VSSP source line subsequently to complete the whole SRAM amplification operation. The role of Flash Charger is to ensure that the $\Delta V_{Q\text{-}QB}$ is more than 15% of the $\Delta Vt=1V$ to compensate the mismatches of the devices along the paths of the parasitic nodes of Q and QB.

In yet another specific embodiment, the present invention discloses a method of a Store operation including two steps. The first step uses a FN-channel VNN Erase scheme to decrease the paired Flash transistor Vts to a same initial low Vt. The second step uses another FN-channel Program scheme to increase both Flash cell Vts with a desired $\Delta Vt \geq 1V$ with a support of SBPI method. Another option of VNN FN-edge and VPP FN-channel can also be used for the Store operation.

In still another specific embodiment, the present invention discloses one paired Flash transistor configured into a voltage follower along with the Flash Charger by making the voltage level difference between two data nodes of Q and QB $\Delta V_{Q\text{-}QB} > 30\%$ of Vt level difference between the paired Flash transistor $\Delta Vt12$ if the Flash Charger generates enough HV charges by ramping up the Flash Charger's gates to a HV level below VPP during a Recall operation.

In an alternative embodiment, the present invention provides that channel length of each Flash transistor can be flexibly increased to generate more coupling HV charges to Q and QB nodes for ensuring the success of the voltage follower operation.

In another alternative embodiment, the present invention provides that gate voltage of each Flash transistor can be flexibly increased to the highest level of VPP to generate more coupling charges below Mch1 and Mch2 with a shorter channel length for area reduction.

In yet another alternative embodiment, the present invention provides that gate voltage of Flash word line, FWL, can be flexibly increased from a negative value to a highest level of maximum Vt level, preferred to be positive, of the Flash transistors to help generate coupling charges for a DRAM-like charge-sensing scheme. In other words, more charges differences at paired Q and QB nodes can be achieved by taking the ramp gate of FWL on the flash transistors with a $\Delta Vt$.

In still another alternative embodiment, the present invention discloses a preferred amplification method for both the 12T NVSRAM cell with a Flash Charger and the Pseudo-10T NVSRAM cells with a shared Flash Charger by presetting the Q and QB to be VSS initially with a grounded flash gate FWL and ramping up the FWL but limited below a highest level of the paired Flash transistors Vt before ramping up the gate of above VDD but below VPP.

In this manner, the timing RC-affect leakage level from Pump node to Q and QB can be minimized to achieve higher voltage level difference $\Delta V_{Q-QB}$ at SRAM cell's Q and QB nodes for a superior Recall operation when a SRAM VDDP line is ramped up first and followed by ramping down SRAM's VSSP line to complete the whole amplification DRAM-like charge-sensing scheme.

In other embodiments, the present invention provides a method for setting initial SRAM power lines of VDDP and VSSP reversed for cancelling the mismatches of paired NMOS devices in each 6T SRAM cell without consuming any DC standby current. The reversed initial set up means VDDP=VSS but VSSP=VDD. Note, the Nwell regions (NW) of SRAM's two Inverters are commonly kept at VDD.

In yet other embodiments, the present invention discloses that channel length of the paired Flash transistor has to be made long enough to prevent the channel punch-through due to Drain-to-Source voltage $V_{DS}$ drop being more than 5V during the floating-gate charge coupling operation.

In a specific embodiment, the present invention provides a 12T NVSRAM memory cell circuit with a pair of flash-based transistors as a voltage charger. The 12T NVSRAM memory cell includes a SRAM cell comprising two inverters cross-coupled to a first pass transistor and a second pass transistor commonly gated by a first word line and respectively coupled drains to a first bit line and a second bit line and sources to a first data node and a second data node. The first data node and the second data node respectively are outputted from the two invertors. Each inverter includes a PMOS device connected to a first power line and a NMOS device connected to a second power line. The first power line and the second power line are operated between a VDD power supply and ground and are separated from a common Nwell node. The 12T NVSRAM memory cell also includes a Flash cell comprising a first cell string and a second cell string sharing a common P-sub. The first/second cell string includes a first/second Select transistor, a first/second Flash transistor, and a first/second Charger transistor connected in series. The first Select transistor and the second Select transistor are gated commonly by a select-gate control line and respectively associated with a first drain terminal coupled to the first data node and a second drain terminal coupled to the second data node. The first and the second Flash transistors are gated commonly by a second word line. The first Charger transistor and the second Charger transistor are gated commonly by a pump word line and respectively associated with a first source terminal and a second source terminal. The first source terminal and the second source terminal are left floating.

In an embodiment, the first Charger transistor and the second Charger transistor are configured to ramp the second word line up to the VDD level followed by ramping the pump word line to a high voltage above the VDD level to generate coupling charges to respectively pass a voltage level difference through a first voltage-follower made by the first Flash transistor and the first Select transistor to the first data node and through a second voltage-follower made by the second Flash transistor and the second Select transistor to the second data node. The two cross-coupled inverters are operated to amplify the voltage level difference to a scale of VSS=0V at one of the first data node and the second data node and the VDD level at another one of the first data node and the second data node.

In another specific embodiment, the present invention also provides a paired pseudo-10T NVSRAM memory cell circuit with a shared flash charger. The paired pseudo-10T NVSRAM memory cell includes a first pseudo-10T NVSRAM cell having a first flash source terminal and second flash source terminal and a second pseudo-10T NVSRAM cell having a third flash source terminal and fourth flash source terminal. Additionally, the paired pseudo-10T NVSRAM memory cell includes a first Charger transistor and a second Charger transistor commonly gated by a pump word line. The first Charger transistor has a first charger drain node connected to the first flash source terminal and a first charger source node connected to the third flash source terminal. The second Charger transistor has a second charger drain node connected to the second flash source terminal and a second charger source node connected to the fourth flash source terminal. The first pseudo-10T NVSRAM cell and the second pseudo-10T NVSRAM cell are configured to be substantially same in a NVSRAM cell structure sharing a first common power line and separately a second common power line respectively operated between a VDD power supply and ground. The NVSRAM cell structure includes a SRAM cell comprising two inverters cross-coupled to a first pass transistor and a second pass transistor commonly gated by a first word line and respectively coupled drains to a first bit line and a second bit line and sources to a first data node and a second data node. The first data node and the second data node respectively are outputted from the two invertors. Each inverter includes a PMOS device connected to the first power line and a NMOS device connected to the second power line. The first power line and the second power line are separated from a common Nwell node.

The NVSRAM cell structure further includes a Flash cell comprising a first cell string and a second cell string sharing a common P-sub. The first/second cell string includes a first/second Select transistor, a first/second Flash transistor, and a first/second Charger transistor connected in series. The first Select transistor and the second Select transistor are gated commonly by a select-gate control line and respectively associated with a first drain terminal coupled to the first data node and a second drain terminal coupled to the second data node. The first and the second Flash transistors are gated commonly by a second word line. The first Charger transistor and the second Charger transistor are gated commonly by a pump word line and respectively associated with a first source terminal and a second source terminal. The first source terminal and the second source terminal are left floating.

In an embodiment, the first/second source node of the first pseudo-10T NVSRAM cell is the first/second flash source terminal and the first/second source node of the second pseudo-10T NVSRAM cell is the third/fourth flash source terminal.

In another embodiment, the first Charger transistor and the second Charger transistor are configured to generate coupling charges by ramping the second word line to the VDD level followed by ramping the pump word line to a level above the VDD level and to use a charge-sensing scheme and voltage-follower operation for performing a Recall operation to write a Flash logic state represented by threshold levels of the first Flash transistor and the second Flash transistor in either the first pseudo-10T NVSRAM cell or the second pseudo-10T NVSRAM cell to corresponding SRAM logic state stored by voltage levels of the first data node and the second data node in corresponding the first pseudo-10T NVSRAM cell or the second pseudo-10T NVSRAM cell.

During NVSRAM's Recall operation, the flash part of this pseudo-10T NVSRAM cell is configured into a paired voltage followers with their respective drain voltages preferably supplied by the coupling-generated charges rather than by the current supply from the VDD pin. As a result, the number of transistors used in each Flash string can be reduced from 3T to 2T without a bottom HV Select transistor that has a big overhead of a long channel length. Thus, the pseudo-10T NVSRAM cell can gain another 15% or more in cell size saving.

DETAILED DESCRIPTION OF THE INVENTION

The present invention relates to a preferred 12T NVSRAM cell with a Flash Charger or a pseudo-10T NVSRAM cell comprising one LV 6T SRAM cell, one 4T Flash cell and one shared paired Flash Charger transistors (2T) that can be made of a conventional 2-poly Flash transistor or a 1-poly Select transistor by shorting poly2 and poly1 of the flash cell. These shared 2T Flash Charger transistors are formed on available room of layout spacing between two source nodes of two 10T NVSRAM cells laid in same column without taking extra silicon area. Thus, this preferred pseudo-10T NVSRAM cell makes a cell size of the 12T NVSRAM cell with a Flash Charger effectively equivalent to a 10T cell.

Figure 1A:
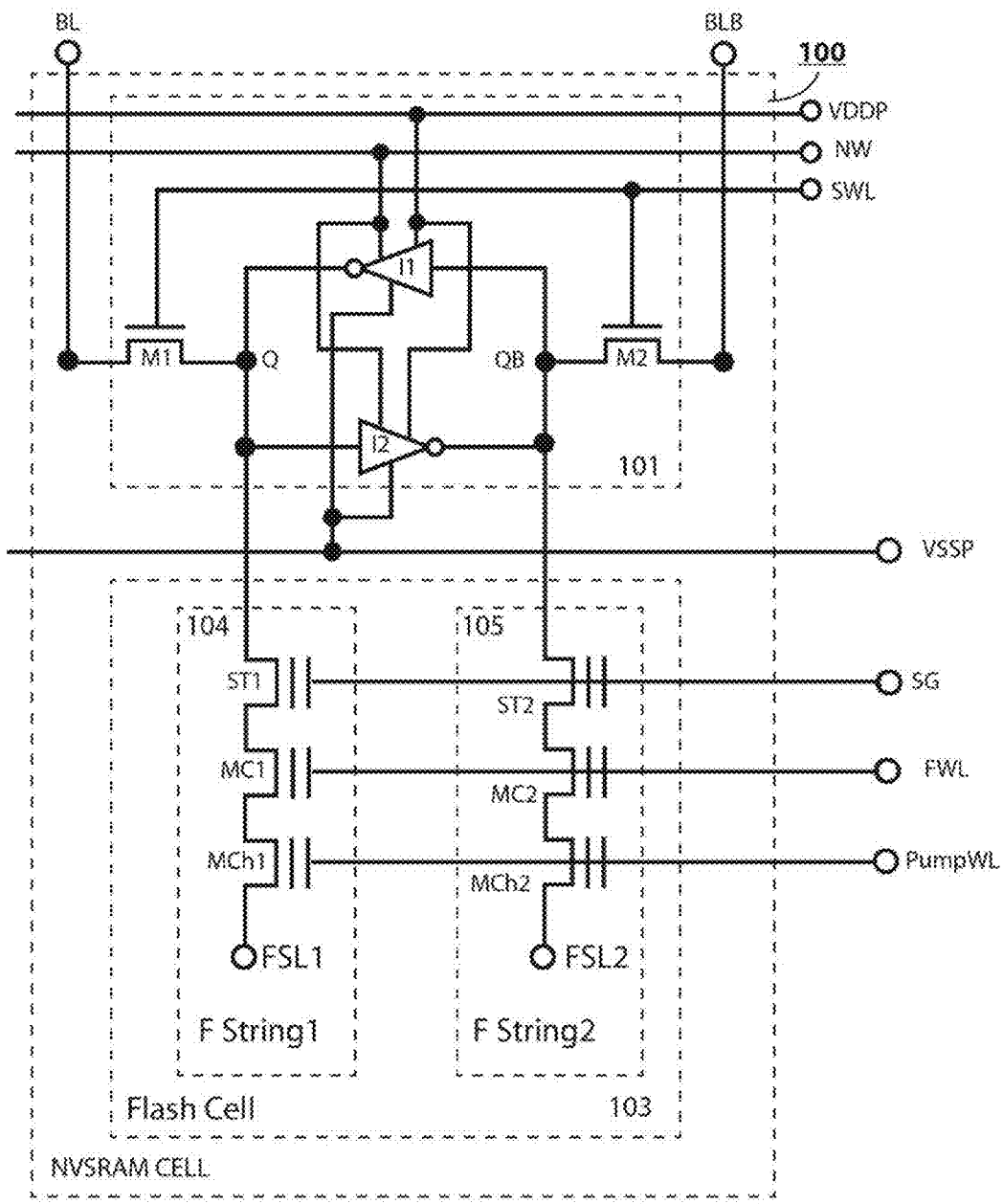
FIG. 1A is a circuit diagram of a 2-poly NMOS 12T NVSRAM cell with a Flash-based Charger according to an embodiment of the present invention.

FIG. 1A shows a preferred embodiment of a 2-poly NMOS 12T NVSRAM cell with a Flash-based Charger of the present invention. Each 12T NVSRAM cell with a Flash Charger 100 includes one 6T LV SRAM cell 101 and one 6T NMOS 2-poly Flash cell 103. Each 6T LV SRAM cell 101 is like conventional one having two inverters I1 and I2 respectively outputting two data nodes of Q and QB coupled to two LV NMOS devices M1 and M2 with their gates coupled to common word line SWL and drain nodes respectively to bit lines BL and BLB. The two Inverters have coupled the PMOS devices and NMOS devices therein respectively to two common power lines VDDP and VSSP, separated from their common Nwell region coupled to NW node. Each 6T NMOS 2-poly Flash cell 103 comprises two fully symmetrical 3T NMOS 2-poly Flash strings 104 and 105. Each String, e.g., FString1 104 further includes one 2-poly NMOS Flash transistor MC1 in the middle, one top Select transistor of ST1 and one additional Charge transistor Mch1 in the bottom with its source node FSL1 left floating. Another 3T Flash string, FString2 105 includes one 2-poly NMOS Flash transistor MC2 in the middle, one top NMOS Select transistor of ST2, and one more NMOS Charge transistor Mch2 in the bottom with its source node FSL2 left floating. The top Select transistor ST1 or ST2 can be made of 2-poly NMOS flash device or 1-poly Flash design with the shortage of poly2 layer and poly1 layer. The Charge transistors Mch1 and Mch2 are made by the same type transistors as the paired Flash transistors MC1 and MC2. Both Select transistor ST1 and ST2 are commonly gated by a control signal SG. Both Flash transistors MC1 and MC2 are commonly gated to a flash word line FWL. Both NMOS Charge transistors Mch1 and Mch2 are commonly gated to a power line PumpWL for providing control of coupled charges to the two FStrings 104 and 105.

Figure 1B:
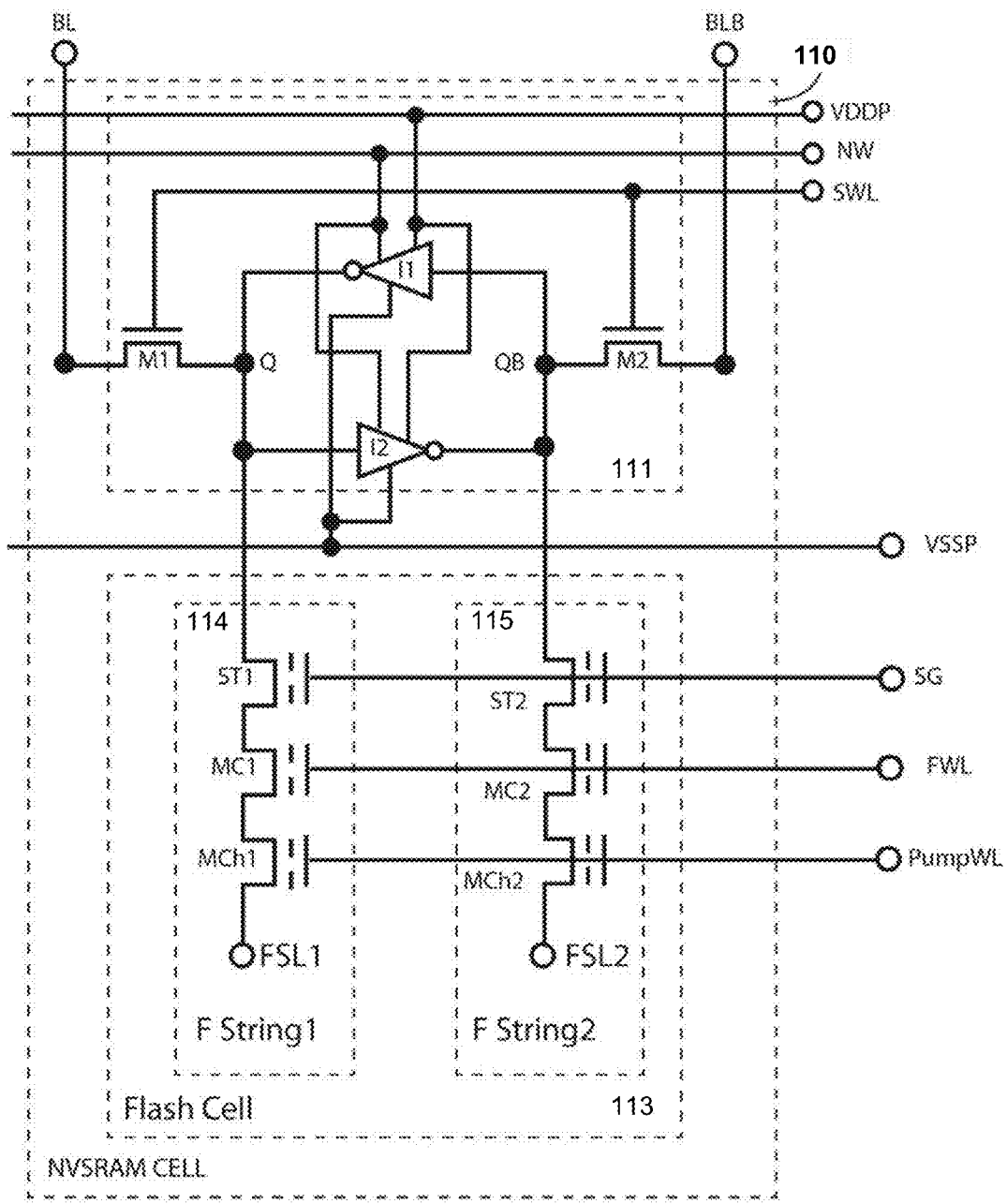
FIG. 1B a first preferred embodiment of a 1-poly SONOS or MONOS 12T NVSRAM cell with a Flash-based Charger according to another embodiment of the present invention.

FIG. 1B shows another preferred embodiment of a 1-poly SONOS or MONOS 12T NVSRAM cell with a Flash-based Charger of the present invention. Each 12T NVSRAM cell 110 includes one 6T LV SRAM cell 111 and one 6T 1-poly Flash cell 113. Each 6T LV SRAM cell 111 is like conventional one having two inverters I1 and I2 respectively outputting two data nodes of Q and QB coupled to two LV NMOS devices M1 and M2 with their gates coupled to common word line SWL and drain nodes respectively to bit lines BL and BLB. The two Inverters have coupled the PMOS devices and NMOS devices therein respectively to two common power lines VDDP and VSSP, separated from their common Nwell region coupled to NW node. Each 6T 1-poly Flash cell 113 comprises two fully symmetrical 3T 1-poly Flash strings 114 and 115. Each String, e.g., FString1 114 further includes one 1-poly charge-trapping type Flash transistor MC1 in the middle, one top Select transistor of ST1 and one additional transistor Mch1 in the bottom with its source node FSL1 left floating. Another 3T Flash string, FString2 115 includes one 1-poly Flash transistor MC2 in the middle, one top Select transistor of ST2, and one more 1-poly transistor Mch2 in the bottom with its source node FSL2 left floating. Both Select transistor ST1 and ST2 are commonly gated by a control signal SG. Both 1-poly transistors Mch1 and Mch2 are commonly gated to a power line PumpWL for providing control of coupled charges to the two FStrings 114 and 115.

Figure 1C:
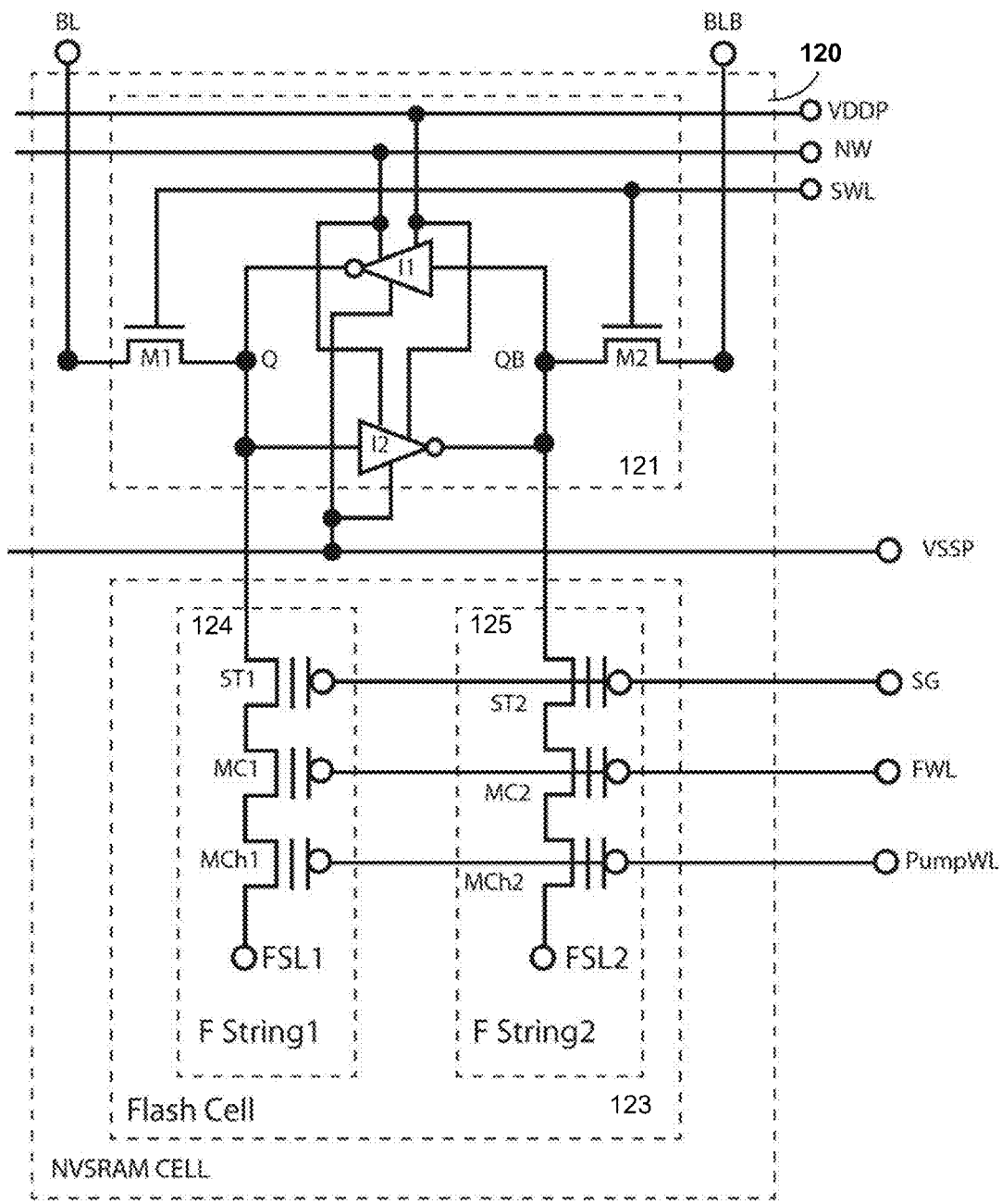
FIG. 1C is a circuit diagram of a 2-poly PMOS 12T NVSRAM cell with a Flash-based Charger according to yet another embodiment of the present invention.

FIG. 1C shows yet another preferred embodiment of a 2-poly PMOS 12T NVSRAM cell with a Flash-based Charger of the present invention. Each 12T NVSRAM cell 120 includes one 6T LV SRAM cell 121 and one 6T PMOS 2-poly Flash cell 123. Each 6T LV SRAM cell 121 is like conventional one having two inverters I1 and I2 respectively outputting two data nodes of Q and QB coupled to two LV NMOS devices M1 and M2 with their gates coupled to common word line SWL and drain nodes respectively to bit lines BL and BLB. The two Inverters have coupled the PMOS devices and NMOS devices therein respectively to two common power lines VDDP and VSSP, separated from their common Nwell region coupled to NW node. Each 6T PMOS 2-poly Flash cell 123 comprises two fully symmetrical 3T PMOS 2-poly Flash strings 124 and 125. Each String, e.g., FString1 104 further includes one 2-poly PMOS Flash transistor MC1 in the middle, one top Select transistor of ST1 and one additional transistor Mch1 in the bottom with its source node FSL1 left floating. Another 3T Flash string, FString2 125 includes one 2-poly PMOS Flash transistor MC2 in the middle, one top PMOS Select transistor of ST2, and one more PMOS transistor Mch2 in the bottom with its source node FSL2 left floating. The top Select transistor ST1 or ST2 can be made of 2-poly NMOS flash device or 1-poly Flash design with the shortage of poly2 layer and poly1 layer. Both Select transistor ST1 and ST2 are commonly gated by a control signal SG. Both PMOS transistors Mch1 and Mch2 are commonly gated to a power line PumpWL for providing control of coupled charges to the two FStrings 104 and 105.

The reason for configuring the middle paired Flash transistors between the top Select transistor and the Flash Charger into a preferred paired Voltage-Follower is to allow the stored ΔVt in the paired Flash transistors can be easily detected and then fully passed to the paired input nodes, Q and QB, of an Amplifier, which is the 4T latch part of a 6T SRAM cell.

The regular operation of a so-called Voltage-Follower needs to meet the following equation of Vg−Vt≤Vd, where Vg is the gate voltage of Flash pairs. Vt is Flash transistor's channel threshold level. There are two Vt values of a paired Flash transistors with preferred ΔVt>1V. Vd is a common drain voltage which is supplied by the boosted charges generated by ramping up Flash Charger gate to a desired voltage between a low voltage VDD and a high voltage VPP to generate coupled charges below the Flash Charger transistor's channel. If the coupled charges are not sufficient to make Vd>Vg−Vt, then the outputs of the paired Voltage-Followers would not be equal to the ΔVt of the paired Flash transistors. The outputs of ΔVt of the paired Voltage-Followers are coupled to paired nodes, Q and QB, of each SRAM cell with $\Delta V_{Q\text{-}QB}$. The best case of Recall operation is under the condition of $\Delta V_{Q\text{-}QB}=\Delta Vt$. In other words, the ΔVt in the paired Flash transistors is 100% reflected by $\Delta V_{Q\text{-}QB}$ at each SRAM's paired storage nodes of Q and QB. Most of time, the $\Delta V_{Q\text{-}QB}<\Delta Vt$ and should be improved by using either a higher VPP ramping voltage or a larger channel length.

Figure 2A:
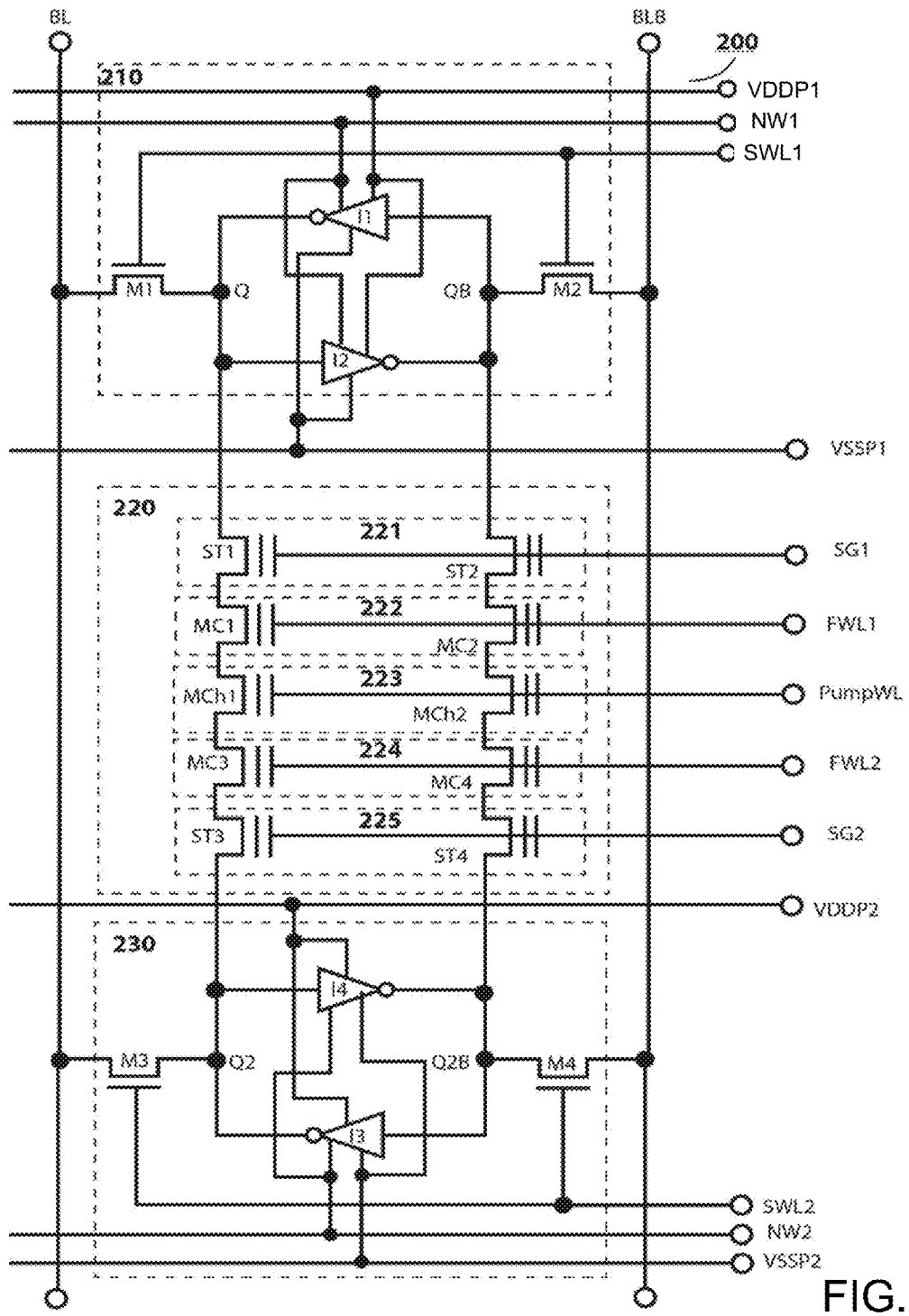
FIG. 2A is a circuit diagram of a paired 2-poly NMOS Pseudo-10T NVSRAM cell with a shared Flash-based Charger according to an alternative embodiment of the present invention.
Figure 2B:
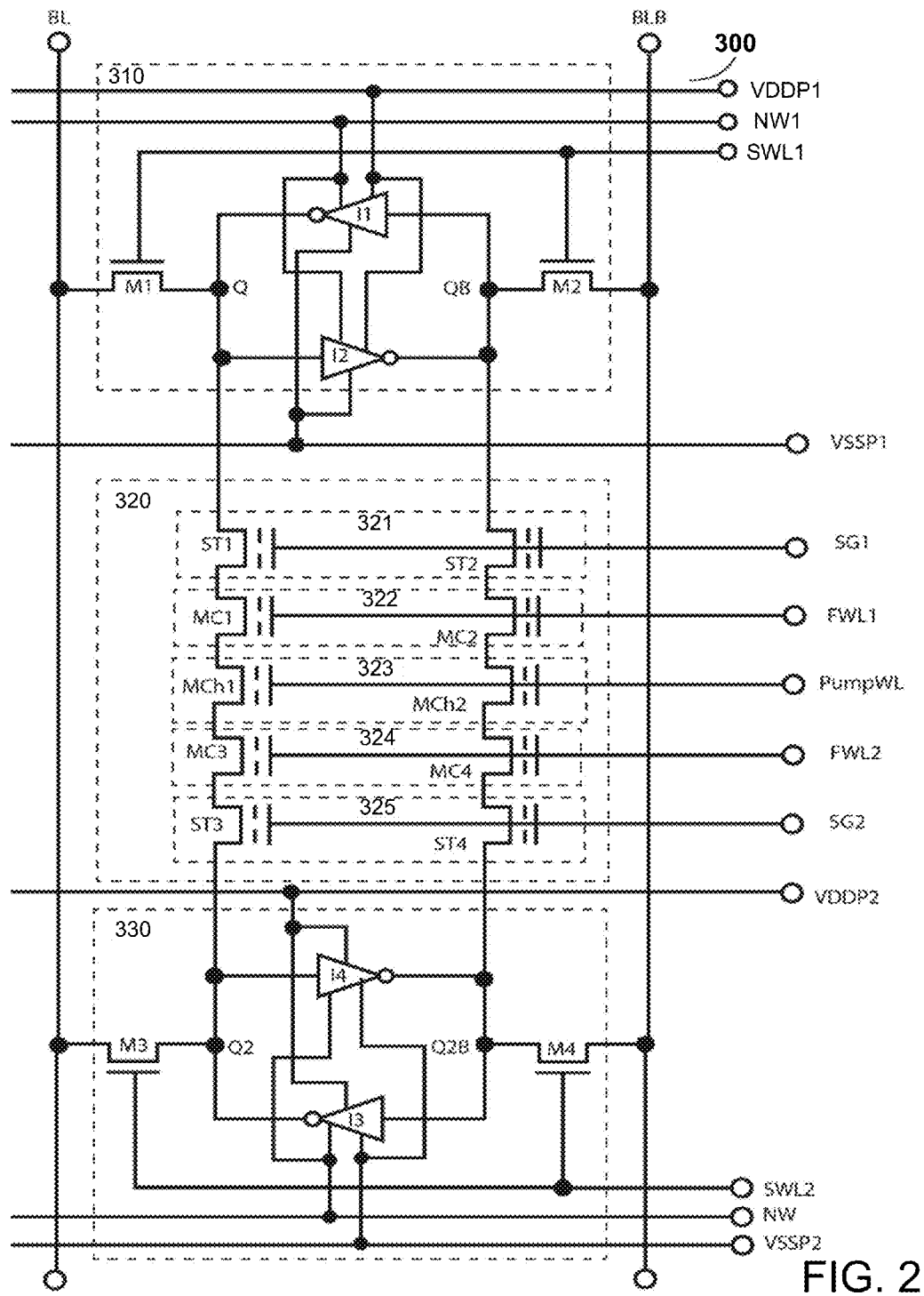
FIG. 2B is a circuit diagram of a paired 1-poly SONOS or MONOS Pseudo-10T NVSRAM cell with a shared Flash-based Charger according to another alternative embodiment of the present invention.
Figure 2C:
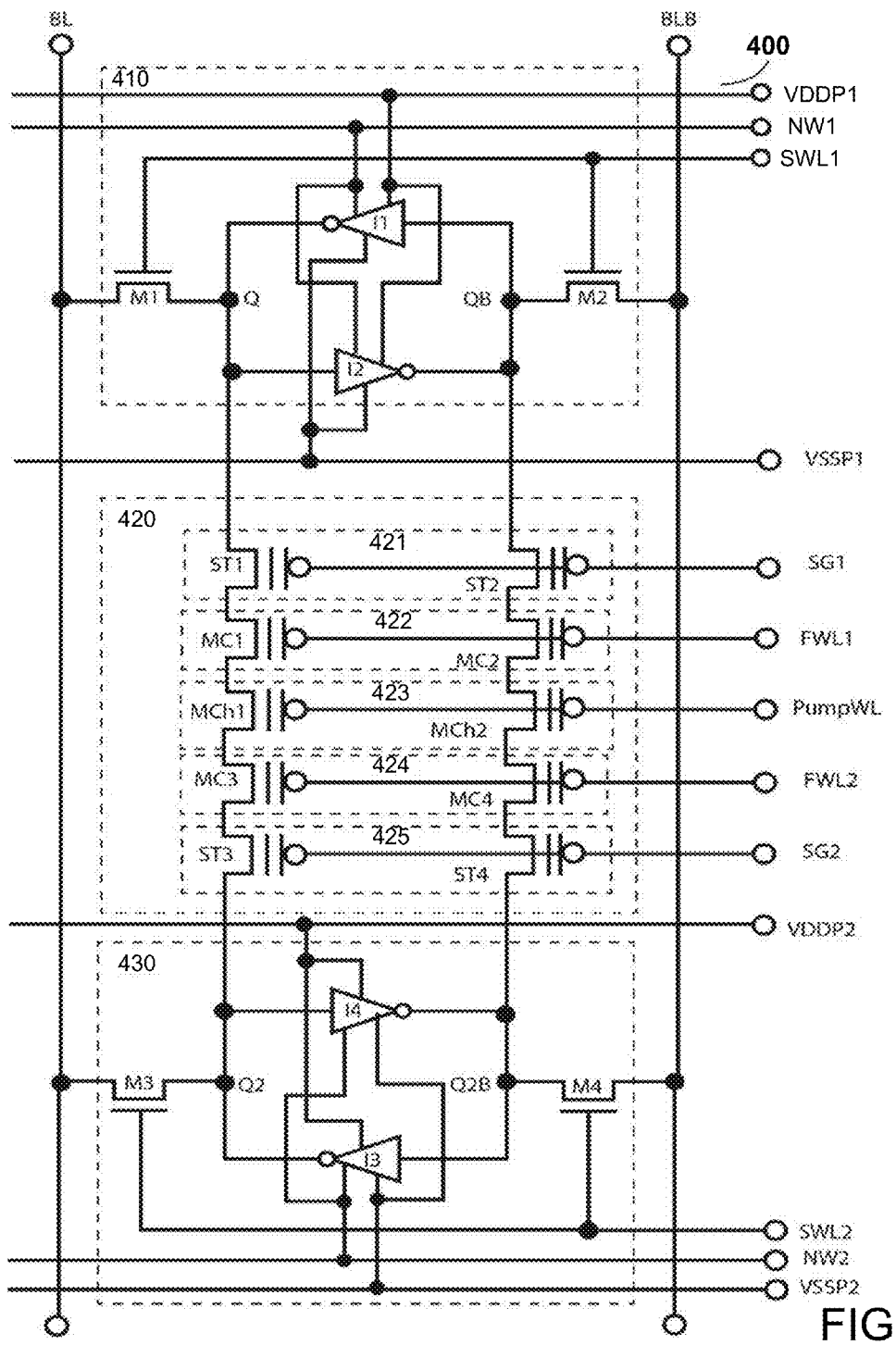
FIG. 2C is a circuit diagram of a paired 2-poly PMOS Pseudo-10T NVSRAM cell with a shared Flash-based Charger according to yet another alternative embodiment of the present invention.

Due to this paired fully symmetrical cell structure and layout, the parasitic capacitance on both Q and QB nodes and the connections to Flash drain nodes of MC1 and MC2 are substantially tracking to set up a good foundation for this preferred 12T NVSRAM cell with a Flash Charger using a DRAM-like charge-sensing scheme for a Recall operation. Now, the operations of the 12T NVSRAM cell with a Flash Charger of FIG. 1A are described first below. Other versions in FIGS. 1B and 1C are substantially similar. Additional descriptions for the operations of pseudo-10T NVSRAM cells based on FIGS. 2A-2C are almost the same as the 12T NVSRAM cell with a Flash Charger of FIGS. 1A-1C with some minor changes in biased conditions for Recall and Store operations and will be given in later sections of the specification.

The detailed steps for operating this 12T NVSRAM cell with a Flash-based Charger and array in different operations will be explained below.

1) 6T SRAM operation: In each SRAM operation, each corresponding Flash cell is preferably isolated from each corresponding SRAM cell. The isolation of the biased conditions is preferably set as shown below:
  A) SWL=VDD for the selected SRAM cells in a single SRAM word line WL, but SWL=VSS for the non-selected SRAM cells in other N−1 WLs.
  B) VDDP=VDD and VSSP=VSS.
  C) SG=VSS to disconnect the drain node of ST1 from Q node and drain node of ST2 from QB node.
  D) FWL=X, which means FWL voltage becomes don't-care and can be set either VDD or VSS.
  E) PumpWL=X, which means PumpWL voltage becomes don't-care and can be set either at VDD or VSS.

2) Flash operation: This operation includes two sub-operations such as FN-channel Erase operation to decrease both paired flash transistor Vts to a same initial preferred value Vt≤VSS=0V and the FN-edge Program operation to increase the paired flash transistor Vts with a desired ΔVt≤1V. The biased conditions for performing this operation are explained below.

A) Erase operation: Using a preferred negative high voltage VNN FN-channel scheme to decrease the paired Flash transistor Vts to a same initial value of Vt≤0V.

TABLE 1

| 2-step Erase | VDDP | SWL | BL | BLB | Q | QB | VSSP | SG | FWL | PumpWL |
|---|---|---|---|---|---|---|---|---|---|---|
| first step: Isolation | VDD | X | X | X | X | X | VSS | VSS | VSS | VSS |
| second step: Erase | VDD | X | X | X | X | X | VSS | VSS | VNN | VSS |

If ST1 and ST2 are 2-poly flash transistors, then their Vts are preferably set to be the same with a positive value of around 0.7V for a desired 1.2V VDD operation. This can be done by using a negative HV VNN FN-channel Erase scheme to first decrease the Vt level and using a positive HV VPP FN-channel Program scheme to set to be around 0.7V with Q=QB=VSS.

If ST1 and ST2 are poly1-gate flash transistors, then poly1-gate Vt is set from flash process control. The poly1-gate is achieved by shorting poly2 and poly1 Together. This is the simplest way and most desired by the present invention. Since the (program or erase) operation speed of Flash String is not important, thus the shortage of poly1 and poly2 can be done per 32 or 64 NVSRAM cells in X-direction of a whole NVSRAM memory chip to save the area.

In first Isolation step, the SG=VSS and the SRAM cell is set to be a normal power setup condition such as VDDP=VDD and VSSP=VSS and other signals are Don't-care ("X" state means either VSS or VDD works) as shown in TABLE 1 above.

In second Erase step, the FWL is ramped down from VSS to a negative high voltage VNN~−18V. The VNN −HV operation is defined to remove the plurality of electrons from floating-gate of 2-poly Flash cell or Nitride layer of 1-poly Flash cell type. As a result, both Flash transistor Vts would be decreased to a same desired negative value Vt<0V after a predetermined erase time ≈5 ms. In other words, Vt(MC1)=Vt(MC2)≤0V, regardless of their old Vt values retained after last program. In a preferred embodiment, Vt(MC1)=Vt(MC2)<−2V.

B) Program operation: Using a preferred high positive VPP FN-channel scheme for increasing one Flash transistor Vt and using SBPI method for inhibiting the other Flash transistor Vt with a desired $\Delta Vt \geq 1.0V$. The bias conditions are shown in TABLE 2 below.

TABLE 2

| 2-step Program | VDDP | SWL | MC1 Vt | MC2 Vt | Q | QB | VSSP | SG | FWL | Pump WL |
|---|---|---|---|---|---|---|---|---|---|---|
| First step Preset | VDD | VSS | $\leq -2$ V | $\leq -2$ V | VDD | VSS | VSS | VDD | VSS | VSS |
| Second step Program | VDD | VSS | $\geq 1.0$ V | $\leq 0$ V | VDD | VSS | VSS | VDD | VPP | VSS |

In first Preset step, the Select gate signal SG is set to VDD to pass VSS and VDD-Vt respectively to the drains of MC1 and MC2 with Flash gate FWL set to VSS and flash Charger gate PumpWL to VSS. In an exemplary Case 1: For an initial SRAM logic state "0", the Q and QB nodes are respectively at the VDD level and VSS. With Q=VDD and QB=VSS initially, then MC1 drain voltage level is at VDD-Vt(ST1) and MC2 drain voltage level is at VSS (under conditions of ST1 and ST2 commonly gated by SG=VDD and Vt(ST1)=0.7V). SRAM power lines VDDP and VSSP are set in normal bias condition of VDDP=VDD, VSSP=VSS. Both threshold levels of Flash transistors MC1 and MC2 are assigned to a negative value $\leq -2V$.

In the second Program step, the Flash gate FWL is ramped up from VSS to a positive HV of VPP, ranging from +15V to +18V for a 2-poly flash cell, or +10V for a 1-poly NONOS flash cell. The channel of the flash transistor MC1 with an initial floating voltage of VDD-VT=1.1V would be boosted to above 5V by coupling effect from high gate voltage VPP. After VPP FN-channel Program operation within a desired 10 ms program time, the MC2 Flash cell with drain node held at VSS state would get programmed, but MC1 with drain node held at initial VDD-Vt state would get Program-Inhibited. As a result, the final desired Vt1(MC1) remains smaller than 0V (i.e., remains at -2V) but Vt2(MC2) increases to greater than 1V. Therefore, the Flash logic state stored in the paired Flash transistors MC1 and MC2 would be defined as "1".

3) Store operation: This operation is similarly defined as above Program operation to write each SRAM cell logic state into the paired Flash transistors MC1 and MC2. Thus the details should be the same above and will not be repeated here for brevity. There are three kinds of Store operations as explained below.

A) Auto-Store operation: This operation is performed upon the VDD power loss. Every SRAM cell logic data has to be written into its corresponding NVM Flash cell of paired Flash transistors MC1 and MC2 automatically in each 12T NVSRAM cell with a Flash Charger.

B) Software-Store operation: This operation is performed upon the call of Software-Store command controlled initiated by the off-chip MCU. Usually, it involves a sequence of defined steps.

C) Hardware-Store operation: This operation is performed upon the call of hardware-Store command controlled by one pin and initiated by the off-chip MCU. Usually, it also involves a sequence of defined steps.

FIG. 2A shows a circuit diagram of a paired 2-poly NMOS Pseudo-10T NVSRAM cell with a shared flash-based charger according to an alternative embodiment of the present invention. Each Pseudo-10T NVSRAM cell comprises one 6T LV SRAM cell and one 2T 2-poly NMOS Flash cell as shown in FIG. 1A with one shared NMOS Flash Charger placed right between two mirrored 6T SRAM cells adjacent physically on top and bottom. The room to insert this shared 2T is by taking the active spacing in two source nodes between two pseudo-10T NSVRAM cells. Thus, no extra room is needed for adding the paired transistors for the 2-poly Flash Charger. As a result, each pseudo-10T NVSRAM cell with a shared 2-poly paired transistor has 12 transistors but in a same layout size of a 10T NVSRAM cell.

As shown, the top pseudo-10T NVSRAM cell includes one LV 6T SRAM cell 210 and one 4T Flash cell, which is at upper part of the circuit box 220. Each SRAM cell 210 includes two Inverters I1 and I2 with a paired storage nodes of Q1 and Q1B and Pass-WL transistors of M1 and M2 with the gate tied to SWL1. Corresponding power lines include VDDP1 and VSSP1 for top pseudo-10T NVSRAM cell. Each flash cell comprises one paired top 2-poly (1-poly is preferred) NMOS Select transistors, ST1 and ST2 in box 221 with a common gate tied to SG1 and one paired 2-poly NMOS Flash transistors, MC1 and MC2, in box 222 with a common gate tied to FWL1.

Conversely, the bottom mirrored pseudo-10T NVSRAM cell comprises of another one LV 6T SRAM cell 230 and one 4T Flash cell at lower part of circuit box 220. The SRAM cell 230 includes two Inverters I3 and I4 with a paired storage nodes of Q2 and Q2B and Pass-WL transistors of M3 and M4 with a common gate tied to SWL2. Corresponding power lines include VDDP2 and VSSP2 for the bottom pseudo-10T NVSRAM cell. The 4T Flash cell mentioned above comprises one paired top 2-poly (1-poly is preferred) NMOS Select transistor, ST3 and ST4, in box 225 with a common gate tied to SG2 and one paired 2-poly NMOS Flash transistor, MC3 and MC4, in box 224 with a common gate tied to FWL2.

In addition, both top and bottom pseudo-10T NVSRAM cells share one circuit including one paired Flash-based transistor, Mch1 and Mch2, in box 223 with a common gate tied to PumpWL. In real chip layout, the shared Flash Charger (paired Mch1 and Mch2) is laid in between the spacing of source nodes of top pair of MC1 and MC2 and source nodes of the bottom pair of MC3 and MC4. The layout room of the shared Flash Charger circuit does not really take one extra row in the NVSRAM memory as compared to the counterpart of a 12T NVSRAM cell shown in FIG. 1A of the present invention.

Besides, both drain and source nodes of Mch1 and Mch2 are separated in layout in FIG. 2A. When Flash Charger's gate signal, PumpWL, is ramped to VPP1, Mch1 and Mch2 would generate individual coupled charges below their respective channels so that no sharing between these generated coupled charges between Mch1 and Mch2. The charges generated from Mch1 would flow to either Q1 and Q2 based on the following Vt conditions of MC1 and MC2.

FIG. 2B is a circuit diagram of a paired 1-poly SONOS or MONOS Pseudo-10T NVSRAM cell with a shared flash-based charger according to another alternative embodiment of the present invention. The only change is the Flash transistor type, 1-poly SONOS or MONOS charge trapping type transistor is used to replace 2-poly NMOS floating-gate type transistor.

FIG. 2C is a circuit diagram of a paired 2-poly PMOS Pseudo-10T NVSRAM cell with a shared flash-based charger according to yet another alternative embodiment of the present invention. The only change is the Flash transistor type, 2-poly PMOS floating-gate type transistor is used to replace 2-poly NMOS floating-gate type transistor.

4) Recall operation: A first description is given below based on the paired pseudo-10T NMOS NVSRAM cells with a shared Flash Charger described above, with references to the simulation circuit of FIG. 5A based on FIG. 2A and associated results of simulation waveforms of FIG. 5B.

In particular, in an example (Case A), a Flash Charger transistor Mch1 is configured to generate HV charges that goes only to Q1 of the top SRAM cell of the top pseudo-10T NVSRAM cell when a top pseudo-10T NVSRAM Flash transistor Vt(MC1)<FWL1 and in corresponding bottom pseudo-10T NVSRAM another Flash transistor Vt(MC3)>FWL2. Here in the example, FWL2=FWL1. The charges flow would be blocked by MC3 but passed by MC1.

In another example Case B), Mch1's generated HV charges go only to Q2 of the bottom SRAM cell of the bottom pseudo-10T NVSRAM cell when the Vt(MC1)>FWL1 and the other Vt(MC3)<FWL2. The charges flow would be blocked by MC1 but passed by MC3.

Further in yet another example (Case C), Mch1 generated HV charges will not go to both Q1 and Q2 on top and bottom pseudo-10T NVSRAM cells when Vt(MC1)<FWL1 and Vt(MC3)<FWL2. The charges flow would be blocked by both MC1 and MC3.

Similarly, the above explanation is valid to Mch2 generated charges distribution between Q1B and Q2B. In still another example (Case D), Mch2 generated HV charges go to Q1B only when Vt(MC2)<FWL1 but Vt(MC4)>FWL2. The charges flow would be blocked by MC4 but passed by MC2.

In one more example (Case E), Mch2 generated HV charges go to Q2B only when Vt(MC2)>FWL1 but Vt(MC4)<FWL2. The charges flow would be blocked by MC2 but passed by MC4.

In a final example (Case F), Mch1 generated HV charges will not go to both Q1B and Q2B, when Vt(MC2)<FWL1 and Vt(MC3)<FWL2. The charges flow would be blocked by both MC1 and MC3. In the present invention, the FWL1=FWL2=FWL=VDD, and ST1=ST2=ST=VDD.

Now, the Recall operation of the pseudo-10T 2-poly NMOS NVSRAM cell will be explained below with reference to FIG. 5A (to be shown below) that shows a paired pseudo-10T NVSRAM cell with a shared Flash Charger in the middle but the drain and source nodes of Flash Charger devices, Mch1 and Mch2, are laid separated in layout. The SG1 and SG2 are tied together. Similarly, the FWL1 and FWL2 are also tied together. The VDDP and VSSP of top and bottom pseudo-10T NVSRAM cells are also tied together in reality.

With above set up conditions, both top and bottom pseudo-10T NVSRAM cells can be programmed and erased simultaneously. In addition, the Store and Recall operations of both NVSRAM cells can be done on the same time too. In addition, once SG1=SG2=VSS, then both pseudo-10T NVSRAM cell's SRAM cells can be read and write independently as a normal two SRAM cells in two different WLs.

In Recall operation, as opposite to the conventional 12T NVSRAM cell using the SRAM-like current charging scheme to charged up with a different voltages of $\Delta V_{Q\text{-}QB}$ at nodes, Q and QB, due to the $\Delta Vt$ stored in paired Flash transistors, MC1 and MC2, with initial Q=QB=VSS and Vt(MC1)<0<Vt(MC2), this pseudo-10T NVSRAM cell in accordance with the present invention uses a DRAM-like charge-sensing scheme and a circuit to make $\Delta V_{Q\text{-}QB}$>0.2V. In a preferred embodiment, the flash transistor with lower initial Vt is a negative value about −2V and the other Flash transistor with higher initial Vt is preferred to be a positive value above the VDD level. The Recall operation for a pair of pseudo-10T NVSRAM cells with a shared flash Charger is preferably divided into six steps as shown in the TABLE 3 below.

TABLE 3

| Recall | First step | Second step | Third step | Fourth step | Fifth step | Sixth step |
|---|---|---|---|---|---|---|
| Q1 | VSS | VSS | V1 | V3/VDD | VSS/VDD | VSS/VDD |
| Q1B | VSS | VSS | V2 | VDD/V3 | VDD/VSS | VDD/VSS |
| Q2 | VSS | VSS | V1 | V3/VDD | VSS/VDD | VSS/VDD |
| Q2B | VSS | VSS | V2 | VDD/V3 | VDD/VSS | VDD/VSS |
| BL | VSS | X | X | X | X | Low/High |
| BLB | VSS | X | X | X | X | High/Low |
| SWL1 & SWL2 | VDD pulse | VSS | VSS | VSS | VSS | VDD |
| VDDP | VSS | VSS | VSS | Ramps to VDD | Stays at VDD | VDD |
| PumpWL | VSS | VSS | Ramps to VPP1 | Stays at VPP1 | Stays at VPP1 | VSS |
| VSSP | VSS | Ramps to VDD | VDD | VDD | Ramps to VSS | VSS |
| SG | VPP2 | VPP2 | VPP2 | VPP2 | VPP2 | VSS |
| FWL1 & FWL2 | VSS | Ramps to VDD | Stays at VDD | Stays at VDD | Stays at VDD | VSS |
| Function | SRAM initial set Q = QB = VSS By pulsing SWL & connect SRAM & Flash | Setup the paired Flash Voltage Follower By setting FWL = VDD≤ Vtmax | Detecting ΔVt stored In MC1 & MC2 by ramping Flash Charger's gate of PumpWL | 1st SRAM Amplification by ramping VDDP to VDD | 2nd SRAM Amplification by ramping VSSP to VSS | Back to SRAM operation |

0 V < V1, V2 < V3 < VDD, VDD < VPP1 < VPP, VPP2 = VDD + Vt(Select transistor)

The above VPP1 voltage is defined as VDD<VPP1<VPP. But VPP2=VDD+Vt to fully pass the coupling-generated HV charges from the Flash Charger to Q and QB nodes.

The exact voltage of VPP1 is preferred to be as high as possible to near VPP so that the Flash Charger can generate sufficient coupling HV charges below the channels of Mch1 and Mch2 to maintain a normal Voltage Follower operation. That means the coupled channel voltage in Mch1 and Mch2 are preferably equal or higher than the gate voltage of the common flash word line FWL.

In an alternative embodiment, the flash word line FWL1 and FWL2 (both are tied together) can be ramped to VSS (if both Vts of two Flash transistors are positive) or to −2V (if one Vt is positive, and one Vt is negative but not lower than −2V) to turn off both Flash transistors after the start of the First SRAM amplification and the second SRAM amplification for achieving better full digital VDD/VSS level with improved isolation between the top SRAM cell amplification and the bottom SRAM cell amplification.

The Recall operations of the 12T 2-poly NMOS NVSRAM cell with a Flash Charger shown in FIG. 1A is substantially like those operated through either the top or bottom pseudo-10T NVSRAM cell described above. In one or more embodiments, the Recall operations of the 12T 1-poly NMOS NVS-RAM cell with a Flash Charger shown in FIGS. 1B and 12T PMOS 2-poly NVSRAM cell with a Flash Charger shown in FIG. 1C would be similar to the operations as explained above. In particularly, the Recall operations of the pseudo-10T 1-poly NMOS NVSRAM cell shown in FIG. 2B and pseudo-10T PMOS 2-poly NVSRAM cell shown in FIG. 2C would be similar to the operations for FIG. 2A as explained above.

In a specific embodiment, FIG. 1B shows another 12T NVSRAM cell with a Flash Charger but with 1-poly transistor Flash cell. All operations would be same as those for operating the 12T NVSRAM cell with a Flash Charger with 2-poly transistor type in FIG. 1A but with some differences in VPP and VNN voltages. In the NVSRAM memory using cells shown in FIG. 1A, +/−18V is used for VPP and VNN. But in the NVSRAM memory using cells shown in FIG. 1B, +/−10V is used for VPP and VNN due to reducing the number of layers. The FN-channel-erase and Fn-edge program operation for FIG. 1B has less tunneling electric field, thus slower erase and program speed. But in principle, the ΔVt generated by ramping the paired Flash Charger transistors, Mch1 and Mch2, and ramping FWL to VDD to transfer the voltage level difference $\Delta V_{Q-QB}$ at Q and QB nodes of each SRAM cell can be achieved by using the same technique and steps. Thus the detailed description is skipped here for brevity.

In another specific embodiment, in FIG. 1C a 10T PMOS 2-poly NVSRAM cell uses 2-poly PMOS Flash transistor and 2-poly PMOS Flash Charger transistor, all operations and steps are the same except the voltage polarity of the FWL voltage has to be ramped from VDD to VSS because the opposite operating condition of the PMOS NVSRAM cell to NMOS NVSRAM cell. The PumpWL voltage is ramped up by using VPP, rather VNN to generate the positive charges in MC3 and MC4 channels.

Referring to FIG. 2A again, only one Flash Charger is required for two adjacent pseudo-10T NVSRAM cells in column direction of memory chip silicon layout. In addition, this Flash Charger includes one paired same 2-poly NMOS flash transistors of Mch1 and Mch2 that can be made right on the source-spacing of two pseudo-10T NVSRAM cells. As a result, the effective cell size becomes like a 10T NMOS 2-poly NVSRAM cell and is referred as a Pseudo-10T NVS-RAM cell. Thus this Pseudo-10T 2-poly NVSRAM cell size can be further reduced from a regular pseudo-10T 2-poly NVSRAM cell size in FIG. 1A by around 15%.

As shown in the FIG. 2A, the pseudo-10T NVSRAM cells with a shared flash Charger has no more floating source nodes. The major difference between FIG. 1A and FIG. 2A is the Pumped HV charges generated by the shared Flash Charger (Mch1 and Mch2) would be shared by one top Pseudo-10T NVSRAM cell and one bottom Pseudo-10T NVSRAM cell. As a result, the generated charged may not enough to sustain the voltage follower circuit for two NVS-RAM cells in mirror. But this can be compensated by increasing the 2-fold charges by doubling the channel lengths of the Flash Charger transistors Mch1 and Mch2 to keep the same performance in the Recall operation as in FIG. 1A for the 12T NVSRAM cell with a larger cell size.

Other operations such as FN-channel Erase and FN-channel Program for the top Pseudo-10T NVSRAM cell and the bottom Pseudo-10T NVSRAM cell with a shared Flash Charger should be the same as the description in FIG. 1A for a 12T NVSRAM cell with a Flash Charger.

For example, the Erase operation can be performed simultaneously on MC1 and MC2 of the top Pseudo-10T NVS-RAM cell and the MC3 and MC4 of the bottom Pseudo-10T NVSRAM cell by applying the same VPP voltage to FWL1 in top Pseudo-10T NVSRAM cell and FWL2 to the bottom Pseudo-10T NVSRAM cell on the same time with preset biased conditions of Q1=Q1B=Q2=Q2B=VSS and SWL1=SWL2=VSS to isolate top SRAM cell from top Flash cell and bottom SRAM cell from the bottom Flash cell. In today's NVSRAM cell, FWL1 and FWL2 can be shorted together into one with just one decoder in whole 16 Mb NVSRAM memory chip with all NVSRAM cells formed in M rows and N columns. The PumpWL is at a don't-care state which can be either at VDD or VSS.

Similarly, to program both MC1 and MC2 of the top Pseudo-10T NVSRAM cell and the MC3 and MC4 of the bottom Pseudo-10T NVSRAM cell, a same VNN voltage can be applied to FWL1 and FWL2 on the same time with the respective VDD and VSS inputs from top paired nodes of Q1 and Q1B and the bottom paired nodes of Q2 and Q2B set by respective top SRAM cell 210 and bottom SRAM cell 230. Any Flash transistor's drain node connected to VDD voltage would get faster FN-edge program than the other Flash transistor's drain node connected to VSS. After a pre-determined program time, both paired MC1 and MC2 in 221 and MC3 and MC4 in 223 would get programmed to a desired ΔVt≥1V.

During a FN-edge program, the voltage of PumpWL line can be set to be VSS to isolate top and bottom NVSRAM cells.

When return back to normal SRAM operation, the FWL1 and FWL2 should be grounded if the Vts of all MC1, MC2, MC3, and MC4 are positive values. If not, then FWL1 and FWL can be coupled to a negative value of −2V if the lowest Vt in MC1, MC2, MC3 and MC4 is not lower than −2V.

In the 2-step SRAM amplification stage (see TABLE 3), the VDDP and VSSP can be tied together in this Pseudo-10T NVSRAM cells with a shared flash Charger, thus the first ramping up of VDDP and second ramping down of VSSP can be performed as a 10T NVSRAM cell. Thus the detailed operation description of the Pseudo-10T NVSRAM cells with a shared flash Charger is also skipped here for brevity for those skilled in this art without undue the scope of the claims herein.

Figure 3:
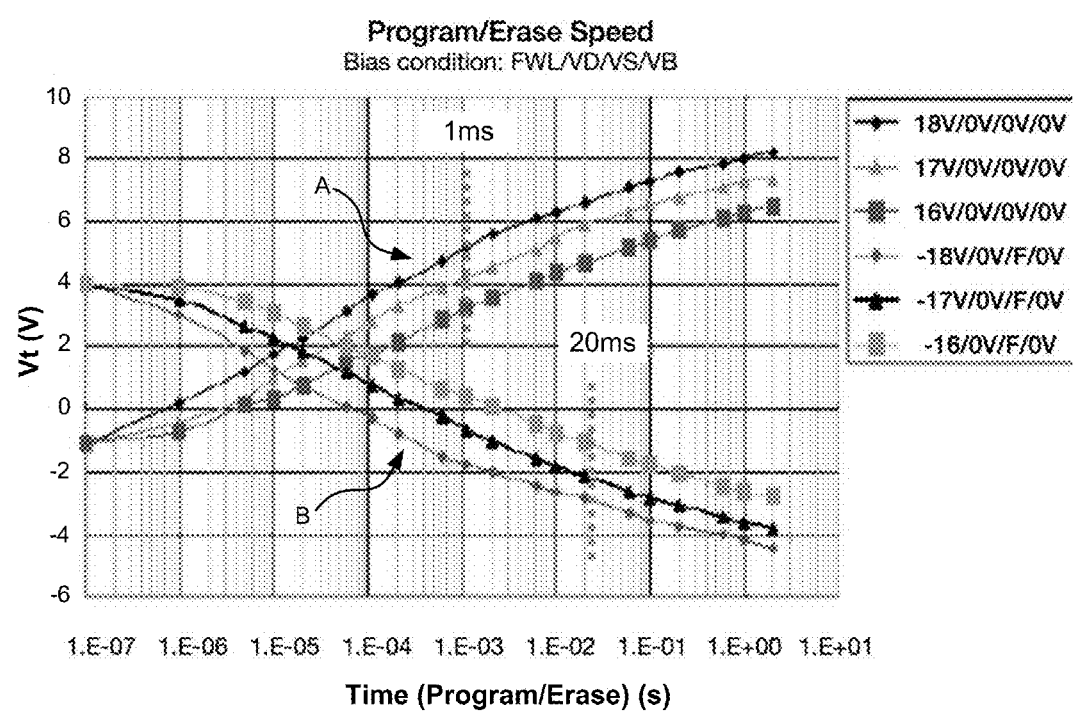
FIG. 3 is a chart showing a NMOS Flash transistor's Vt distribution vs time for both the 12T NVSRAM cell with a Flash Charger and Pseudo-10T NVSRAM cell's FN-channel Program operation that uses a VPP to increase Flash transistor Vts and a FN-channel Erase operation that uses a VNN to decrease Flash transistor Vts in accordance of the present invention.

FIG. 3 shows the graph of a FN-channel erase and FN-channel program operation vs flash gate and channel and time. The FN-channel program scheme in FIG. 3 is used as an FN-channel Erase scheme for the present 12T and Pseudo- 10T NVSRAM cell to increase MC1 and MC2 Vt in the beginning. With 1V difference in gate but same channel voltage, after 1 ms, the ΔVt can be 1V difference. Secondly, with 1 ms, the Flash transistor's Vt can be increased above positive 2V with gate voltage of 18V. This is used by this invention to set the paired Flash Vt to be a positive vale above VDD of 1.8V operation.

Figure 4:
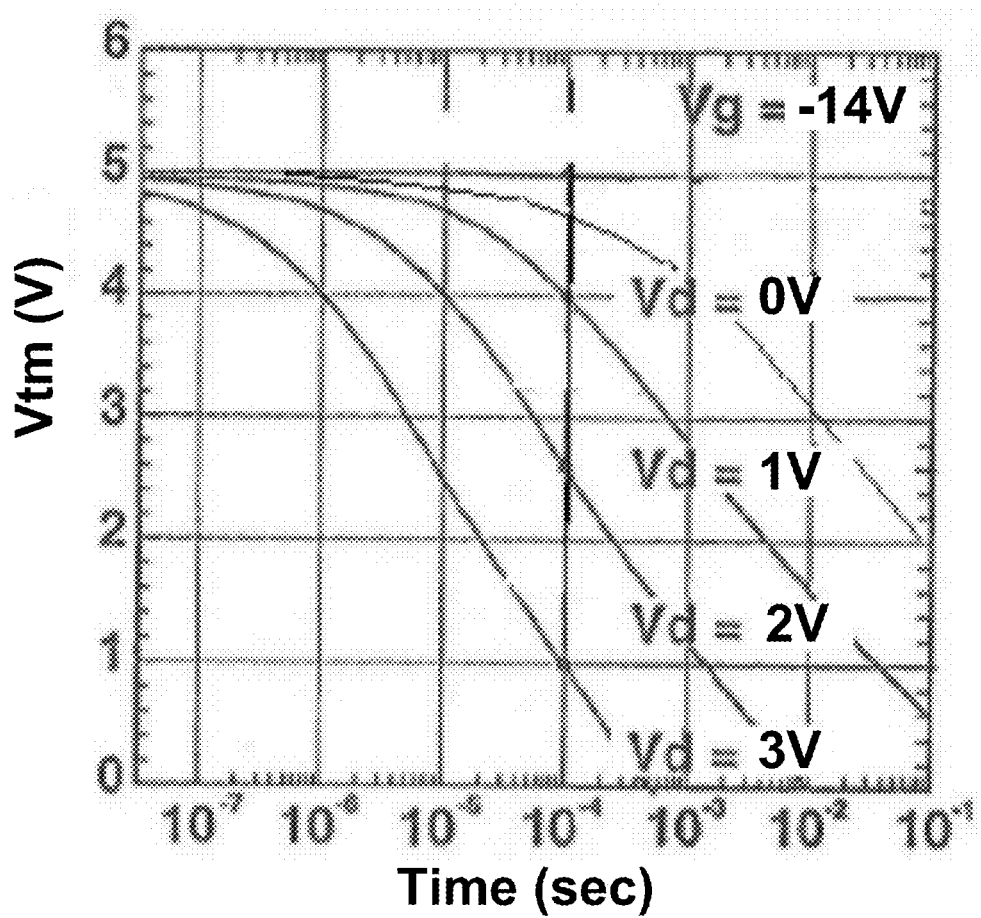
FIG. 4 is a chart showing a NMOS Flash transistor's Vt distribution vs. time of the 12T NVSRAM cell with a Flash Charger and Pseudo-10T NVSRAM's FN-edge Program operation to decrease both Vt of MC1 and MC2 flash cells with a desired ΔVt≥1V in accordance with the present invention.

Conversely, FIG. 4 shows the graph of a low-current FN-edge program to decrease the Vt of flash transistors of MC1 and MC2 for the present 12T NVSRAM cell with a flash Charger and Pseudo-10T NVSRAM cells with a shared flash Charger.

With 1V difference in the flash drain edges of MC1 and MC2 and a same gate voltage of −14V and same floating source. After 100 μs program time, the Vt difference between MC1 and MC2 ΔVt=0.8V is achieved. But after longer program time of 1-5 ms, the ΔVt is increased and kept constant with a ΔVt≈1.5V, which is larger than 1.0V as produced by using VPP FN-channel scheme with same program time. In summary, the FN-edge scheme has a stronger tunneling electric field than FN-channel scheme. Thus, with direct Q and QB voltage coupled to the paired Flash cells without using SBPI method, the FN-edge scheme can generate 1.5-fold ΔVt over the FN-channel scheme.

The other operations of another preferred embodiments of FIG. 2B 1-poly Pseudo-10T NVSRAM cell and FIG. 2C 2-poly PMOS Pseudo-10T NVSRAM cell are also skipped here without losing the spirit of the present invention.

Besides, due to a very low VDD and VSS inputs from SRAM's Q and QB nodes to the paired Flash cell, the channel length of MC1 and MC2 can be made with a minimum pitch to save the flash size, thus the cell size reduction for both the 12T NVSRAM cell with a Flash Charger and the pseudo-10T NVSRAM cell of the present invention.

One disadvantage of the SBPI scheme is that the channel of top and bottom Select transistors has to be big than 70 nm to prevent the Vds>5V punch-through from occurring during the SBPI operation. Thus the overhead of Select transistor is big.

The FN-edge scheme can be used to allow the Program operation works without a SBPI method under a low VDD of 1V operation, provided an erase operation is done using FN-channel scheme to increase both Flash transistor Vts to a same higher initial value.

In summary, there are two preferred combination sets of biased conditions of Erase and Program operations for the present 12T NVSRAM cell with a flash Charger and Pseudo-10T NVSRAM cells with a shared flash Charger. These two sets of operation schemes are shown in the TABLE 4 below.

TABLE 4

| Operations | 1$^{st}$ Set | 2$^{nd}$ Set |
|---|---|---|
| Erase | a) Use FN-channel to increase the Vt of MC1 and MC2 simultaneously<br>b) FWL = VPP = 18 V, MC1 Channel = MC2 channel = VSS | a) Use FN-channel to decrease the Vt of MC1 and MC2 simultaneously<br>b) FWL = VNN = −18 V, MC1 Channel = MC2 channel = VSS |
| Program | a) Use FN-edge to decrease the Vt of MC1 and MC2 simultaneously to achieve ΔVt > 1 V<br>b) FWL = VNN = −14 V to −18 V<br>MC1 drain edge = VDD/VSS and MC2 drain edge = VSS/VDD | a) Use FN-channel to increase the Vt of MC1 and MC2 simultaneously to achieve ΔVt > 1 V<br>b) FWL = VPP = +18 V<br>MC1 channel = VDD/VSS and MC2 channel = VSS/VDD |

Figure 5A:
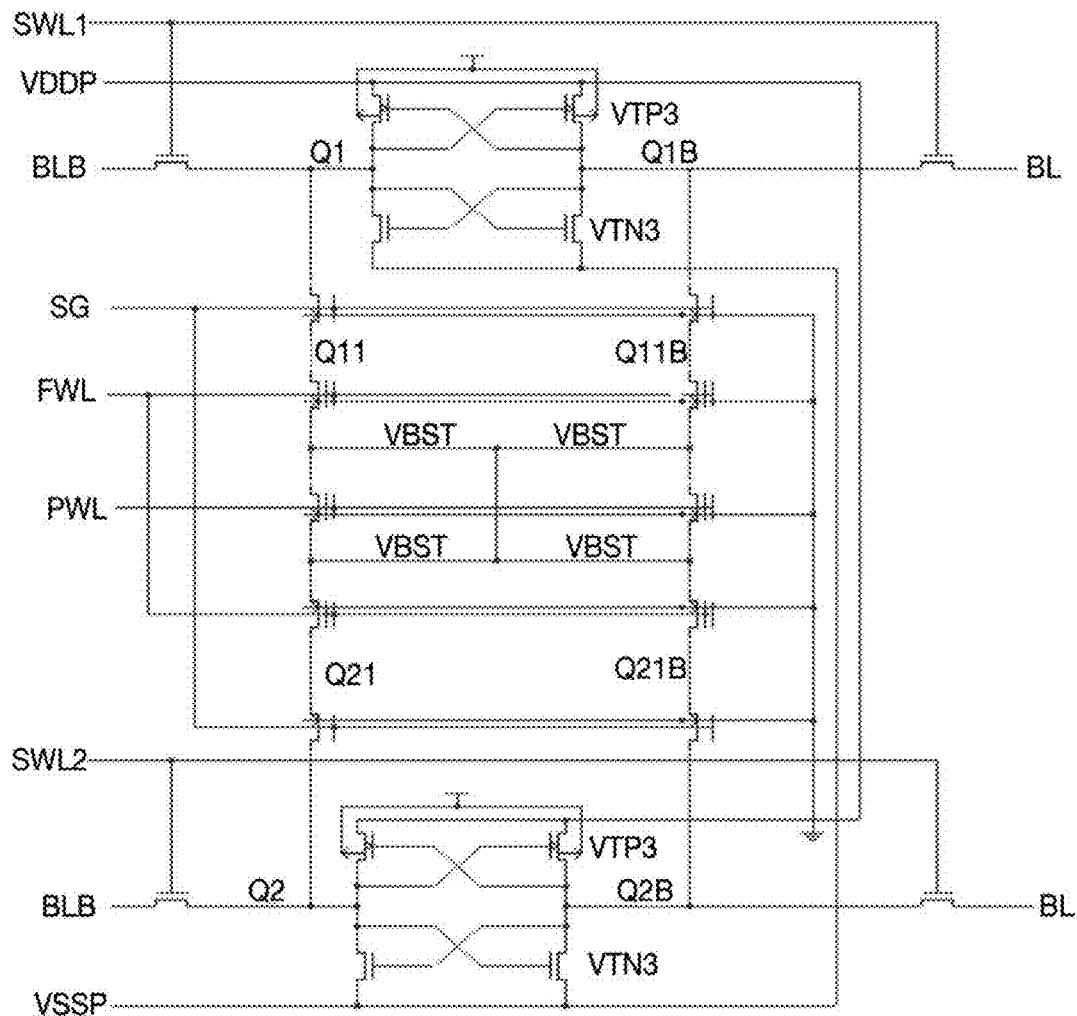
FIG. 5A is a simulation circuit of a paired of pseudo-10T 2-poly NMOS NVSRAM's with the drains and sources nodes of a paired Flash-charger shorted together in accordance with the present invention.

FIG. 5A shows a simulation circuit containing one paired pseudo-10T NVSRAM cell with a shared flash Charger laid in the middle coupled to a control line PWL. The circuit embodiment should refer to the corresponding one shown in FIG. 2A. Four source nodes of the Flash transistors are tied to a common VBST node for simplification of the simulation, which should not unduly limit the scope of the claims herein.

Figure 5B:
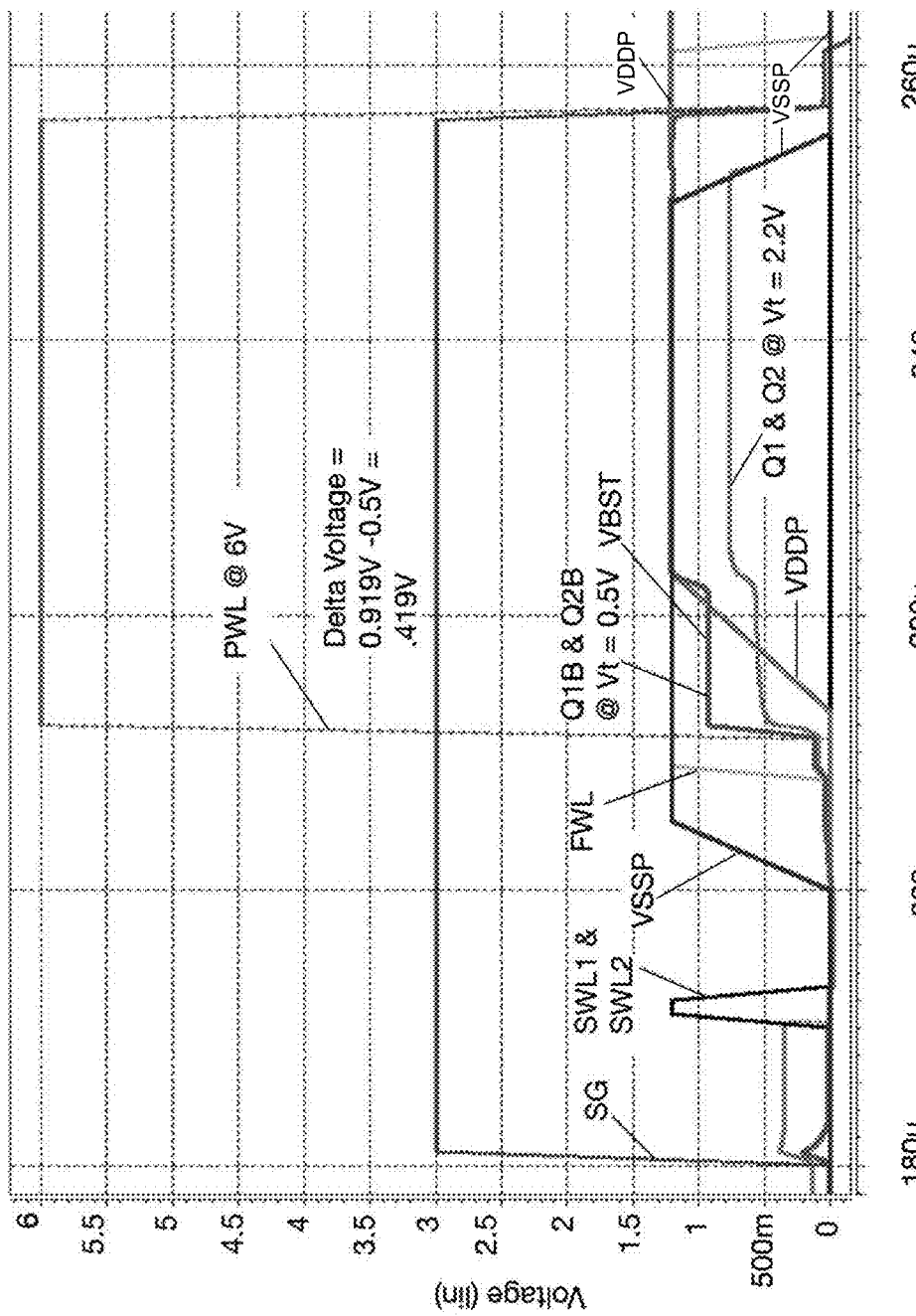
FIG. 5B is simulation result based on the paired pseudo-10T 2-poly NMOS NVSRAM cell with a shared flash-based charger of FIG. 5A in accordance with the present invention.

FIG. 5B shows Recall simulation waveforms of a 12T NVSRAM cell with a flash Charger of FIG. 1A or pseudo-10T NVSRAM cells with a shared flash Charger of FIG. 2A. The waveforms versus time are divided in several steps. The different times shows the desired steps of the Recall operation as explained in previous Table 3. Some numerical assumptions are made with MC1's Vt=2.2V but MC2's Vt=0.5V and ΔVt=1.7V=2.2V-0.5V with FWL ramped to 1.2V VDD and PWL (PumpWL) ramped to 6V. The simulation proves the DRAM-like charging scheme works at 1.2V VDD operation with a Flash Charger using 6V ramping gate signal to generate the required HV charges for the paired Flash Voltage Follower.

In the beginning 0 μs, the SG is ramped to 3V, which is larger than VDD+Vt=1.2V+0.7V=1.9V to allow the full connection between Flash cell and SRAM cell. At around 100 us, a SWL1 and SWL2 pulse is to set Q and QB to VSS for both top and bottom SRAM cells by grounding BL and BLB initially.

At 200 μs, the VSSP line of SRAM cell is ramped to 1.2V but VDDP is grounded reversely.

At around 208 μs, the FWL is ramped to VDD=1.2V to configure the Flash pair into the Voltage Follower pair, MC1 and MC2 pair and MC3 and MC4 pair of respective NVSRAM cells.

At time line 210 μs, the PumpWL (PWL) is ramped to 6V to generate the coupled HV charges below Mch1 and Mch2. These HV charges are shared by top and bottom NVSRAM cells and then sent to respective Q1, Q1B, Q2 and Q2B.

Since MC2=MC4=2.2V is higher than larger than MC1=MC3=0.5V, thus the final Voltages at Q1B=Q2B is larger than Q1=Q2. The $\Delta V_{Q-QB} \approx 0.4V$ at time line 220 μs.

The VDDP is ramped from VSS to VDD from at around 215 μs after PumpWL ramping. The Q1B=Q2B=VDD for the first SRAM amplification. At 250 μs, the VSSP is ramped down to VSS from VDD. As a result, the Q1=Q2=VSS after the second SRAM amplification. The small ΔVt of 1.7V is successfully detected and is fully amplified to a VDD and VSS.

Although the above has been illustrated according to specific embodiments, there can be other modifications, alternatives, and variations. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A 12T NVSRAM memory cell circuit with a pair of flash-based transistors as a voltage charger, the 12T NVSRAM memory cell comprising:
    a SRAM cell comprising two inverters cross-coupled to a first pass transistor and a second pass transistor commonly gated by a first word line and respectively coupled drains to a first bit line and a second bit line and sources to a first data node and a second data node, the first data node and the second data node respectively being outputted from the two inverters, each inverter including a PMOS device connected to a first power line and a NMOS device connected to a second power line, the first power line and the second power line being operated between a VDD power supply and ground and being separated from a common Nwell node; and a Flash cell comprising a first cell string and a second cell string sharing a common P-sub, the first/second cell string including a first/second Select transistor, a first/second Flash transistor, and a first/second Charger transistor connected in series, the first Select transistor and the second Select transistor being gated commonly by a select-gate control line and respectively associated with a first drain terminal coupled to the first data node and a second drain terminal coupled to the second data node, the first and the second Flash transistors being gated commonly by a second word line, the first Charger transistor and the second Charger transistor being gated commonly by a pump word line and respectively associated with a first source terminal and a second source terminal, the first source terminal and the second source terminal being left floating;

wherein the first Charger transistor and the second Charger transistor are configured to ramp the second word line up to the VDD level followed by ramping the pump word line to a high voltage above the VDD level to generate coupling charges to respectively pass a voltage level difference through a first voltage-follower made by the first Flash transistor and the first Select transistor to the first data node and through a second voltage-follower made by the second Flash transistor and the second Select transistor to the second data node, the two cross-coupled inverters are operated to amplify the voltage level difference to a scale of VSS=0V at one of the first data node and the second data node and the VDD level at another one of the first data node and the second data node.

2. The 12T NVSRAM memory cell of claim 1 wherein each of the first Flash transistor and the second Flash transistor is selected from a 2-poly NMOS floating-gate type transistor, a 1-poly SONOS or MONOS charge-trapping type transistor, and a 2-poly PMOS floating-gate type transistor.

3. The 12T NVSRAM memory cell of claim 1 wherein each of the first Charger transistor and the second Charger transistor is a same type as each of the first Flash transistor and the second Flash transistor no matter that is selected from a 2-poly NMOS floating-gate type transistor, a 1-poly SONOS or MONOS charge-trapping type transistor, and a 2-poly PMOS floating-gate type transistor.

4. The 12T NVSRAM memory cell of claim 1 wherein the SRAM cell is subjected to a Read and Write operation by setting the first word line to the VDD level if the SRAM cell is selected or to VSS=0V if the SRAM cell is not selected and applying the VDD level to the first power line and VSS to the second power line, while setting the select-gate control line to VSS along with a Don't care state for the second word line and the pump word line to isolated each SRAM cell from each corresponding Flash cell.

5. The 12T NVSRAM memory cell of claim 1 wherein the Flash cell is subjected to a an Erase operation including a preset step by setting both the first data node and the second data node to VSS under a condition of setting the first word line to the VDD level, the first power line to VSS, the second power line to VSS, the select-gate control line to VSS, followed by an erase step by applying a negative high voltage VNN to the second word line to decrease threshold levels of both the first Flash transistor and the second Flash transistor to ≤−2V under a FN-channel scheme in less than 5 ms, along with a Don't care state for the pump word line.

6. The 12T NVSRAM memory cell of claim 5 wherein the negative high voltage VNN is about −18V for a 2-poly floating-gate type flash transistor or about −10V for a 1-poly charge-trapping type flash transistor, and the VDD level is about 1V to 2V.

7. The 12T NVSRAM memory cell of claim 1 wherein the Flash cell is subjected to a Program operation for defining a flash logic state, the Program operation including a preset step of setting the first word line to VSS, applying the VDD level to the first power line and VSS=0V to the second power line, and loading a logic state "1" of the SRAM cell with the first data node at the VDD level and the second data node at VSS=0V, the Program operation further including a programming step of applying the VDD level to the select-gate control line and ramping the second word line from VSS to a positive high voltage VPP to use a FN-channel scheme to maintain threshold level of the first Flash transistor and increase threshold level of the second Flash transistor to a positive value along with a Don't care state for the pump word line, thereby storing the flash logic state "0" in the Flash cell.

8. The 12T NVSRAM memory cell of claim 1 wherein the Flash cell is subjected to a Program operation for defining a flash logic state, the Program operation including a preset step of setting the first word line to VSS, applying the VDD level to the first power line and VSS=0V to the second power line, and loading a logic state "0" of the SRAM cell with the first data node at VSS and the second data node at the VDD level, the Program operation further including a programming step of applying the VDD level to the select-gate control line and ramping the second word line from VSS to a positive high voltage VPP to use a FN-channel scheme to increase threshold level of the first Flash transistor to a positive value and maintain threshold level of the second Flash transistor along with a Don't care state for the pump word line, thereby storing the flash logic state "1" in the Flash cell.

9. The 12T NVSRAM memory cell of claim 8 wherein the positive voltage VPP is about +18V for a 2-poly floating-gate type flash transistor or about +10V for a 1-poly charge-trapping type flash transistor and the VDD level is preferred to be smaller than 2V.

10. The 12T NVSRAM memory cell of claim 1 wherein the SRAM cell is subjected to a Recall operation for writing a flash logic state stored in the Flash cell back to the first data node and the second data node under a charge-sensing scheme, the flash logic state including at least a state "1" defined by a Vt1 threshold level for the first Flash transistor and a Vt0<0<Vt1 threshold level for the second Flash transistor or a state "0" defined by a Vt0 threshold level for the first Flash transistor and a Vt1>0>Vt0 threshold level for the second Flash transistor.

11. The 12T NVSRAM memory cell of claim 10 wherein the Recall operation for writing a flash logic state "1" to the SRAM cell comprises initializing the SRAM cell with the first data node and the second data node, the first bit line and the second bit line, the first power line and the second power line all at VSS=0V by pulsing the first word line to the VDD level, and setting the second word line and the pump word line to VSS, followed by firstly ramping the second power line from VSS to the VDD level, secondly ramping the second word line from VSS to the VDD level, and thirdly ramping the pump word line from VSS to a voltage substantially above the VDD level, and sequentially ramping the first power line from VSS to the VDD level while maintaining the second power line at the VDD level in a first amplification step followed by ramping the second power line from the VDD level to VSS while maintaining the first power line at the VDD level in a second amplification step.

12. The 12T NVSRAM memory cell of claim 11 wherein the Recall operation further comprises setting the select-gate control line to the VDD level plus a threshold level of either the first Select transistor or the second Select transistor.

13. The 12T NVSRAM memory cell of claim 11 wherein firstly ramping the second power line from VSS to the VDD level comprises forming a reversed bias condition for the two Inverters of the SRAM cell to prevent charges in the first data node and the second data node from leaking.

14. The 12T NVSRAM memory cell of claim 11 wherein secondly ramping the second word line from VSS to the VDD level comprises detecting a coupling charge difference between the first Flash transistor and the second Flash transistor due to Vt0<Vt1.

15. The 12T NVSRAM memory cell of claim 14 wherein thirdly ramping the pump word line from VSS to the voltage substantially above the VDD level comprises keeping gate voltage of the first Charger transistor and the second Charger transistor below a programming voltage VPP of +18V for generating coupling charges in drain nodes of the first Charger transistor and the second Charger transistor, the coupling charges being passed with the coupling charge difference using a voltage-follower operation through the first Flash transistor and the first Select transistor to the first data node with a first level of charges and respectively through the second Flash transistor and the second Select transistor to the second data node with a second level of charges, the first level being higher than the second level due to Vt0<Vt1.

16. The 12T NVSRAM memory cell of claim 15 wherein ramping the first power line from VSS to the VDD level while maintaining the second power line at the VDD level in a first amplification step comprises pulling up the first level of charges at the first data node to substantially the VDD level and pulling up the second level of charges at the second data node to a third level of charges, the third level being lower than the VDD level.

17. The 12T NVSRAM memory cell of claim 16 wherein ramping the second power line from the VDD level to VSS while maintaining the first power line at the VDD level in a second amplification step comprises pulling down the third level of charges at the second data node to VSS=0V while maintaining the VDD level at the first data node.

18. The 12T NVSRAM memory cell of claim 16 wherein ramping the first power line from VSS to the VDD level while maintaining the second power line at the VDD level in a first amplification step comprises coupling the second word line to a negative bias voltage to turn off both the first Flash transistor and the second Flash transistor.

19. The 12T NVSRAM memory cell of claim 17 wherein ramping the second power line from the VDD level to VSS while maintaining the first power line at the VDD level in a second amplification step comprises coupling the second word line to a negative bias voltage below a lowest threshold level to turn off both the first Flash transistor and the second Flash transistor.

20. The 12T NVSRAM memory cell of claim 11 wherein the Recall operation further comprises setting the first word line to the VDD level and resetting the first power line to the VDD level, the second power line to VSS, the select-gate control line to VSS, and the second word line to VSS=0V to return to a SRAM operation with a loaded logic state "1" associated with the VDD at the first data node and VSS at the second data node.

21. A paired pseudo-10T NVSRAM memory cell circuit with a shared flash charger, the paired pseudo-10T NVSRAM memory cell comprising:
a first pseudo-10T NVSRAM cell having a first flash source terminal and second flash source terminal;
a second pseudo-10T NVSRAM cell having a third flash source terminal and fourth flash source terminal; and
a first Charger transistor and a second Charger transistor commonly gated by a pump word line, the first Charger transistor having a first charger drain node connected to the first flash source terminal and a first charger source node connected to the third flash source terminal, the second Charger transistor having a second charger drain node connected to the second flash source terminal and a second charger source node connected to the fourth flash source terminal;
wherein the first pseudo-10T NVSRAM cell and the second pseudo-10T NVSRAM cell are configured to be substantially same in a NVSRAM cell structure sharing separately a first common power line and a second common power line respectively operated between a VDD power supply and ground, the NVSRAM cell structure comprising,
a SRAM cell comprising two inverters cross-coupled to a first pass transistor and a second pass transistor commonly gated by a first word line and respectively coupled drains to a first bit line and a second bit line and sources to a first data node and a second data node, the first data node and the second data node respectively being outputted from the two invertors, each inverter including a PMOS device connected to the first power line and a NMOS device connected to the second power line, the first power line and the second power line being separated from a common Nwell node; and
a Flash cell comprising a first cell string and a second cell string sharing a common P-sub, the first/second cell string including a first/second Select transistor, a first/second Flash transistor, and a first/second Charger transistor connected in series, the first Select transistor and the second Select transistor being gated commonly by a select-gate control line and respectively associated with a first drain terminal coupled to the first data node and a second drain terminal coupled to the second data node, the first and the second Flash transistors being gated commonly by a second word line, the first Charger transistor and the second Charger transistor being gated commonly by a pump word line and respectively associated with a first source terminal and a second source terminal, the first source terminal and the second source terminal being left floating;
wherein the first/second source node of the first pseudo-10T NVSRAM cell is the first/second flash source terminal and the first/second source node of the second pseudo-10T NVSRAM cell is the third/fourth flash source terminal;
wherein the first Charger transistor and the second Charger transistor are configured to generate coupling charges by ramping the second word line to the VDD level followed by ramping the pump word line to a level above the VDD level and to use a charge-sensing scheme and voltage-follower operation for performing a Recall operation to write a Flash logic state represented by threshold levels of the first Flash transistor and the second Flash transistor in either the first pseudo-10T NVSRAM cell or the second pseudo-10T NVSRAM cell to corresponding SRAM logic state stored by voltage levels of the first data node and the second data node in corresponding the first pseudo-10T NVSRAM cell or the second pseudo-10T NVSRAM cell.

22. The paired pseudo-10T NVSRAM memory cell of claim 21 wherein each of the first Flash transistor and the second Flash transistor in either the first pseudo-10T NVSRAM cell or the second pseudo-10T NVSRAM cell is selected from a 2-poly NMOS floating-gate type transistor, a 1-poly SONOS or MONOS charge-trapping type transistor, and a 2-poly PMOS floating-gate type transistor.

23. The paired pseudo-10T NVSRAM memory cell of claim 22 wherein each of the first Charger transistor and the second Charger transistor is a same type as each of the first Flash transistor and the second Flash transistor no matter that is selected from a 2-poly NMOS floating-gate type transistor, a 1-poly SONOS or MONOS charge-trapping type transistor, and a 2-poly PMOS floating-gate type transistor.

24. The paired pseudo-10 T NVSRAM memory cell of claim 23 wherein the SRAM cell in either the first pseudo-10T NVSRAM cell or the second pseudo-10T NVSRAM cell is subjected to a Read and Write operation by setting the first word line to the VDD level if the SRAM cell is selected or to VSS=0V if the SRAM cell is not selected and applying the VDD level to the first power line and VSS to the second power line, while setting the select-gate control line to VSS along with a Don't care state for the second word line and the pump word line to isolated each SRAM cell from each corresponding Flash cell.

25. The paired pseudo-10T NVSRAM memory cell of claim 21 wherein the Flash cell in either the first pseudo-10T NVSRAM cell or the second pseudo-10T NVSRAM cell is subjected to a an Erase operation including a preset step by setting both the first data node and the second data node to VSS under a condition of setting the first word line to the VDD level, the first power line to VSS, the second power line to VSS, the select-gate control line to VSS, followed by an erase step by applying a negative high voltage VNN to the second word line to decrease threshold levels of both the first Flash transistor and the second Flash transistor to ≤−2V under a FN-channel scheme in less than 5 ms, along with a Don't care state for the pump word line.

26. The paired pseudo-10T NVSRAM memory cell of claim 25 wherein the negative high voltage VNN is about −18V for a 2-poly floating-gate type flash transistor or about −10V for a 1-poly charge-trapping type flash transistor, and the VDD level is about 1V to 2V.

27. The paired pseudo-10T NVSRAM memory cell of claim 21 wherein the Flash cell in either the first pseudo-10T NVSRAM cell or the second pseudo-10T NVSRAM cell is subjected to a Program operation for defining a flash logic state, the Program operation including a preset step of setting the first word line to VSS, applying the VDD level to the first power line and VSS=0V to the second power line, and loading a logic state "1" of the SRAM cell with the first data node at the VDD level and the second data node at VSS=0V, the Program operation further including a programming step of applying the VDD level to the select-gate control line and ramping the second word line from VSS to a positive high voltage VPP to use a FN-channel scheme to maintain threshold level of the first Flash transistor and increase threshold level of the second Flash transistor to a positive value along with a Don't care state for the pump word line, thereby storing the flash logic state "0" in the Flash cell.

28. The paired pseudo-10T NVSRAM memory cell of claim 21 wherein the Flash cell in either the first pseudo-10T NVSRAM cell or the second pseudo-10T NVSRAM cell is subjected to a Program operation for defining a flash logic state, the Program operation including a preset step of setting the first word line to VSS, applying the VDD level to the first power line and VSS=0V to the second power line, and loading a logic state "0" of the SRAM cell with the first data node at VSS and the second data node at the VDD level, the Program operation further including a programming step of applying the VDD level to the select-gate control line and ramping the second word line from VSS to a positive high voltage VPP to use a FN-channel scheme to increase threshold level of the first Flash transistor to a positive value and maintain threshold level of the second Flash transistor along with a Don't care state for the pump word line, thereby storing the flash logic state "1" in the Flash cell.

29. The paired pseudo-10T NVSRAM memory cell of claim 28 wherein the positive voltage VPP is about +18V for a 2-poly floating-gate type flash transistor or about +10V for a 1-poly charge-trapping type flash transistor.

30. The paired pseudo-10T NVSRAM memory cell of claim 21 wherein the SRAM cell in either the first pseudo-10T NVSRAM cell or the second pseudo-10T NVSRAM cell is subjected to a Recall operation for writing a flash logic state stored in the Flash cell back to the first data node and the second data node under a charge-sensing scheme, the flash logic state including at least a state "1" defined by a Vt1 threshold level for the first Flash transistor and a Vt0<0<Vt0 threshold level for the second Flash transistor or a state "0" defined by a Vt0 threshold level for the first Flash transistor and a Vt1>0>Vt0 threshold level for the second Flash transistor.

31. The paired pseudo-10T NVSRAM memory cell of claim 30 wherein the Recall operation for writing a flash logic state "1" to the SRAM cell comprises initializing the SRAM cell with the first data node and the second data node, the first bit line and the second bit line, the first power line and the second power line all at VSS=0V by pulsing the first word line to the VDD level, and setting the second word line and the pump word line to VSS, followed by firstly ramping the second power line from VSS to the VDD level, secondly ramping the second word line from VSS to the VDD level, and thirdly ramping the pump word line from VSS to a voltage substantially above the VDD level, and sequentially ramping the first power line from VSS to the VDD level while maintaining the second power line at the VDD level in a first amplification step followed by ramping the second power line from the VDD level to VSS while maintaining the first power line at the VDD level in a second amplification step.

32. The paired pseudo-10T NVSRAM memory cell of claim 31 wherein the Recall operation further comprises setting the select-gate control line to the VDD level plus a threshold level of either the first Select transistor or the second Select transistor.

33. The paired pseudo-10T NVSRAM memory cell of claim 31 wherein firstly ramping the second power line from VSS to the VDD level comprises forming a reversed bias condition for the two Inverters of the SRAM cell to prevent charges in the first data node and the second data node from leaking.

34. The paired pseudo-10T NVSRAM memory cell of claim 31 wherein secondly ramping the second word line from VSS to the VDD level comprises detecting a coupling charge difference between the first Flash transistor and the second Flash transistor due to Vt0<Vt1.

35. The paired pseudo-10T NVSRAM memory cell of claim 34 wherein thirdly ramping the pump word line from VSS to the voltage substantially above the VDD level comprises keeping gate voltage of the first Charger transistor and the second Charger transistor below a programming voltage VPP of +18V for generating coupling charges in drain nodes of the first Charger transistor and the second Charger transistor, the coupling charges being passed with the coupling charge difference using a voltage-follower operation through the first Flash transistor and the first Select transistor to the first data node with a first level of charges and respectively through the second Flash transistor and the second Select transistor to the second data node with a second level of charges, the first level being higher than the second level due to Vt0<Vt1.

36. The paired pseudo-10T NVSRAM memory cell of claim 35 wherein ramping the first power line from VSS to the VDD level while maintaining the second power line at the VDD level in a first amplification step comprises pulling up the first level of charges at the first data node to substantially the VDD level and pulling up the second level of charges at the second data node to a third level of charges, the third level being lower than the VDD level.

37. The paired pseudo-10T NVSRAM memory cell of claim 36 wherein ramping the second power line from the VDD level to VSS while maintaining the first power line at the VDD level in a second amplification step comprises pulling down the third level of charges at the second data node to VSS=0V while maintaining the VDD level at the first data node.

38. The paired pseudo-10T NVSRAM memory cell of claim 36 wherein ramping the first power line from VSS to the VDD level while maintaining the second power line at the VDD level in a first amplification step comprises coupling the second word line to a negative bias voltage to turn off both the first Flash transistor and the second Flash transistor.

39. The paired pseudo-10T NVSRAM memory cell of claim 37 wherein ramping the second power line from the VDD level to VSS while maintaining the first power line at the VDD level in a second amplification step comprises coupling the second word line to a negative bias voltage below a lowest threshold level to turn off both the first Flash transistor and the second Flash transistor.

40. The paired pseudo-10T NVSRAM memory cell of claim 21 wherein the Recall operation further comprises setting the first word line to the VDD level and resetting the first power line to the VDD level, the second power line to VSS, the select-gate control line to VSS, and the second word line to VSS=0V to return to a SRAM operation with a loaded logic state "1" associated with the VDD at the first data node and VSS at the second data node.

41. The paired pseudo-10T NVSRAM memory cell of claim 30 wherein the Vt0 is preferred to be a negative value about −2V and the Vt1 is preferred to be a positive value above the VDD level.

42. The paired pseudo-10T NVSRAM memory cell of claim 21 wherein the first Charger transistor and the second Charger transistor are configured to optionally have their channel lengths doubled for generating doubled charges shared with the first pseudo-10T NVSRAM cell and the second pseudo-10T NVSRM cell enough for performing the Recall operation under the charge-sensing scheme when the Flash logic state represented by threshold levels of the first Flash transistor and the second Flash transistor in the first pseudo-10 T NVSRAM cell is same as the Flash logic state represented by threshold levels of the first Flash transistor and the second Flash transistor in the second pseudo-10T NVSRAM cell.

43. The paired pseudo-10T NVSRAM memory cell of claim 21 wherein the first Charger transistor and the second Charger transistor are configured to have their original channel lengths for generating the charges separately for the first pseudo-10T NVSRAM cell and the second pseudo-10T NVSRM cell enough for performing the Recall operation under the charge-sensing scheme when the Flash logic state represented by threshold levels of the first Flash transistor and the second Flash transistor in the first pseudo-10T NVSRAM cell is opposite to the Flash logic state represented by threshold levels of the first Flash transistor and the second Flash transistor in the second pseudo-10T NVSRAM cell.

\* \* \* \* \*